United States Patent
Lee et al.

(10) Patent No.: US 12,068,260 B2
(45) Date of Patent: Aug. 20, 2024

(54) SEMICONDUCTOR DIE PACKAGE WITH RING STRUCTURE AND METHOD FOR FORMING THE SAME

(71) Applicant: TAIWAN SEMICONDUCTOR MANUFACTURING COMPANY, LTD., Hsinchu (TW)

(72) Inventors: Yu-Chen Lee, Hsinchu (TW); Shu-Shen Yeh, Taoyuan (TW); Chia-Kuei Hsu, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 17/462,431

(22) Filed: Aug. 31, 2021

(65) Prior Publication Data

US 2023/0063270 A1    Mar. 2, 2023

(51) Int. Cl.
*H01L 23/00* (2006.01)
*H01L 25/065* (2023.01)
*H01L 23/498* (2006.01)

(52) U.S. Cl.
CPC ...... *H01L 23/562* (2013.01); *H01L 23/49833* (2013.01); *H01L 24/32* (2013.01);
(Continued)

(58) Field of Classification Search
CPC . H01L 2224/32245; H01L 2224/48247; H01L 23/562; H01L 24/32; H01L 25/0657; H01L 31/0203; H01L 31/02325; H01L 33/486; H01L 33/58; H01L 2224/13101; H01L 2224/16227; H01L 2224/32225;
(Continued)

(56) References Cited

U.S. PATENT DOCUMENTS 11,450,580 B2 * 9/2022 Huang .................... H01L 23/10
11,569,156 B2 * 1/2023 Huang ................ H01L 23/5385
(Continued)

FOREIGN PATENT DOCUMENTS

TW    202117968 A    5/2021
TW    202127591 A    7/2021

*Primary Examiner* — Telly D Green
(74) *Attorney, Agent, or Firm* — Birch, Stewart, Kolasch & Birch, LLP

(57) ABSTRACT

A semiconductor die package and a method of forming the same are provided. The semiconductor die package includes a package substrate and a semiconductor device disposed over the package substrate. A ring structure is disposed over the package substrate and laterally surrounds the semiconductor device. The ring structure includes a lower ring portion arranged around the periphery of the package substrate. Multiple notches are formed along the outer periphery of the lower ring portion. The ring structure also includes an upper ring portion integrally formed on the lower ring portion. The upper ring portion laterally extends toward the semiconductor device, so that the inner periphery of the upper ring portion is closer to the semiconductor device than the inner periphery of the lower ring portion. An adhesive layer is interposed between the lower ring portion and the package substrate.

20 Claims, 22 Drawing Sheets

(52) U.S. Cl.
CPC ...... *H01L 25/0652* (2013.01); *H01L 25/0655* (2013.01); *H01L 25/0657* (2013.01); *H01L 2224/32245* (2013.01)

(58) Field of Classification Search
CPC . H01L 2224/73204; H01L 2224/81801; H01L 23/16; H01L 23/3114; H01L 23/3128; H01L 23/49816; H01L 23/49833; H01L 23/5385; H01L 24/13; H01L 24/16; H01L 24/73; H01L 24/81; H01L 25/0652; H01L 25/0655; H01L 2924/15311; H01L 2924/1711; H01L 2924/1715; H01L 2924/181; H01L 2924/18161; H01L 2224/16225; H01L 23/12; H01L 23/3107; H01L 2924/00012; H01L 2924/00014; H01L 2924/014

See application file for complete search history.

(56) References Cited

U.S. PATENT DOCUMENTS

| | | | |
|---|---|---|---|
| 2012/0001276 A1* | 1/2012 | Huang | B81B 7/0064 |
| | | | 257/416 |
| 2018/0166351 A1* | 6/2018 | Han | H01L 23/053 |
| 2020/0168573 A1* | 5/2020 | Wu | H01L 24/03 |
| 2021/0125907 A1* | 4/2021 | Huang | H01L 21/4853 |
| 2021/0193538 A1* | 6/2021 | Huang | H01L 23/3675 |
| 2022/0102288 A1* | 3/2022 | Hung | H01L 21/50 |
| 2023/0187383 A1* | 6/2023 | Lin | H01L 23/10 |
| | | | 257/668 |

\* cited by examiner

SEMICONDUCTOR DIE PACKAGE WITH RING STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
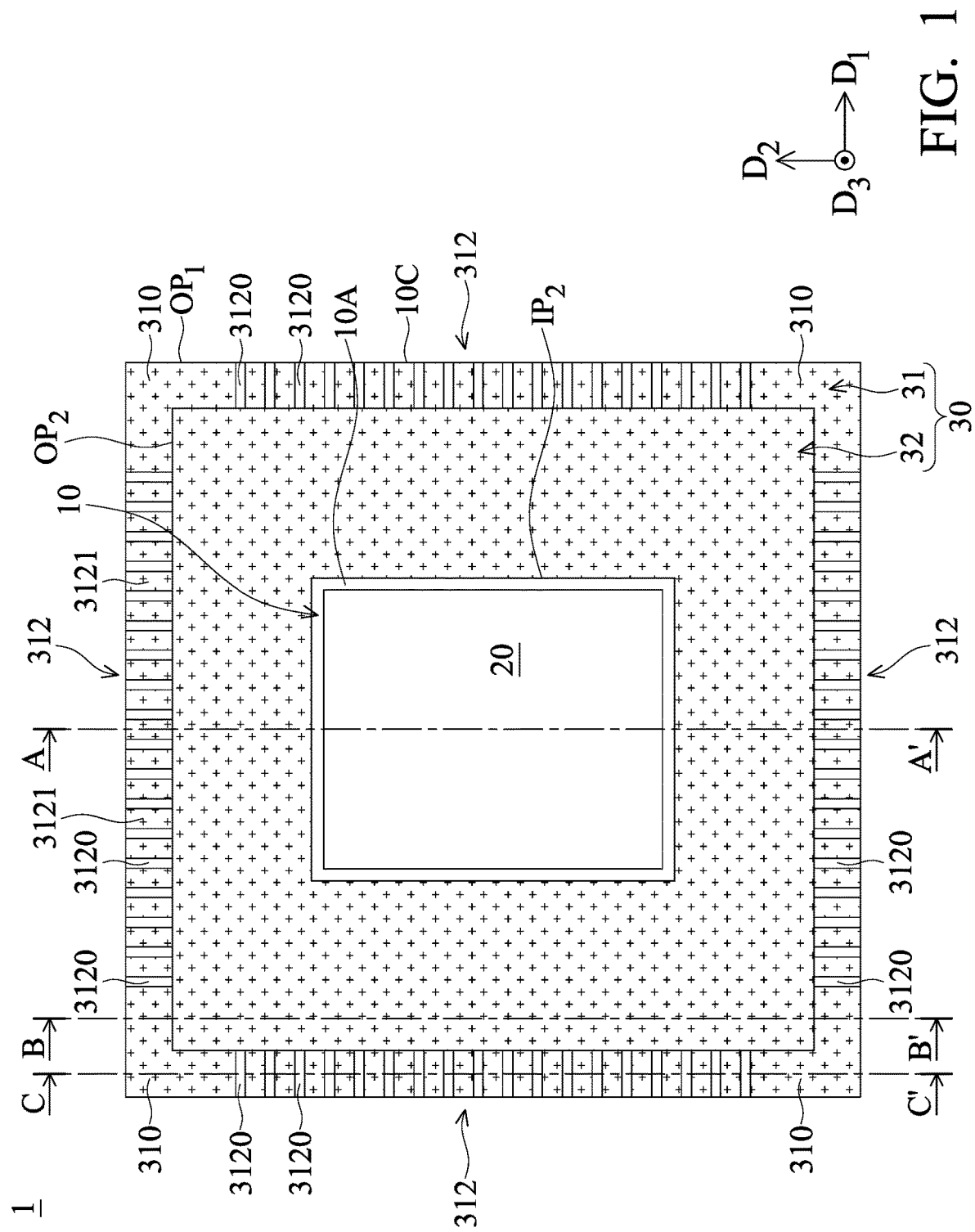
FIG. 1 is a schematic top view of a semiconductor die package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%. The terms "each" in the description are to be interpreted so as not to exclude variations among units and not to exclude an omission of a part of the units.

A semiconductor die package and the method for forming the same are provided in accordance with various embodiments. Some variations of some embodiments are discussed. Throughout the various views and illustrative embodiments, like reference numbers are used to designate like elements.

In accordance with some embodiments of the present disclosure, a semiconductor die package includes a ring structure (stress-relief structure) for controlling warpage of the package substrate. In some embodiments, the ring structure is an one-piece structure having a lower ring portion and an upper ring portion integrally formed on the lower ring portion. The lower ring portion has multiple notches (eliminated parts) arranged on its sides so as to reduce stress generated in the package during thermal cycling. In addition, the corners of the lower ring portion are left (that is, no notches are formed at the corners), and the upper ring portion concentrically covers the lower ring portion and has a part extending beyond the inner periphery of the lower ring portion, thereby increasing the structural strength of the entire ring structure. This also helps to control warpage of the package substrate. Accordingly, the ring structure has better ability to control warpage and stress, and the reliability of the entire package structure is also improved.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order. Further, like reference numbers or indicators refer to like components.

Figure 2A:
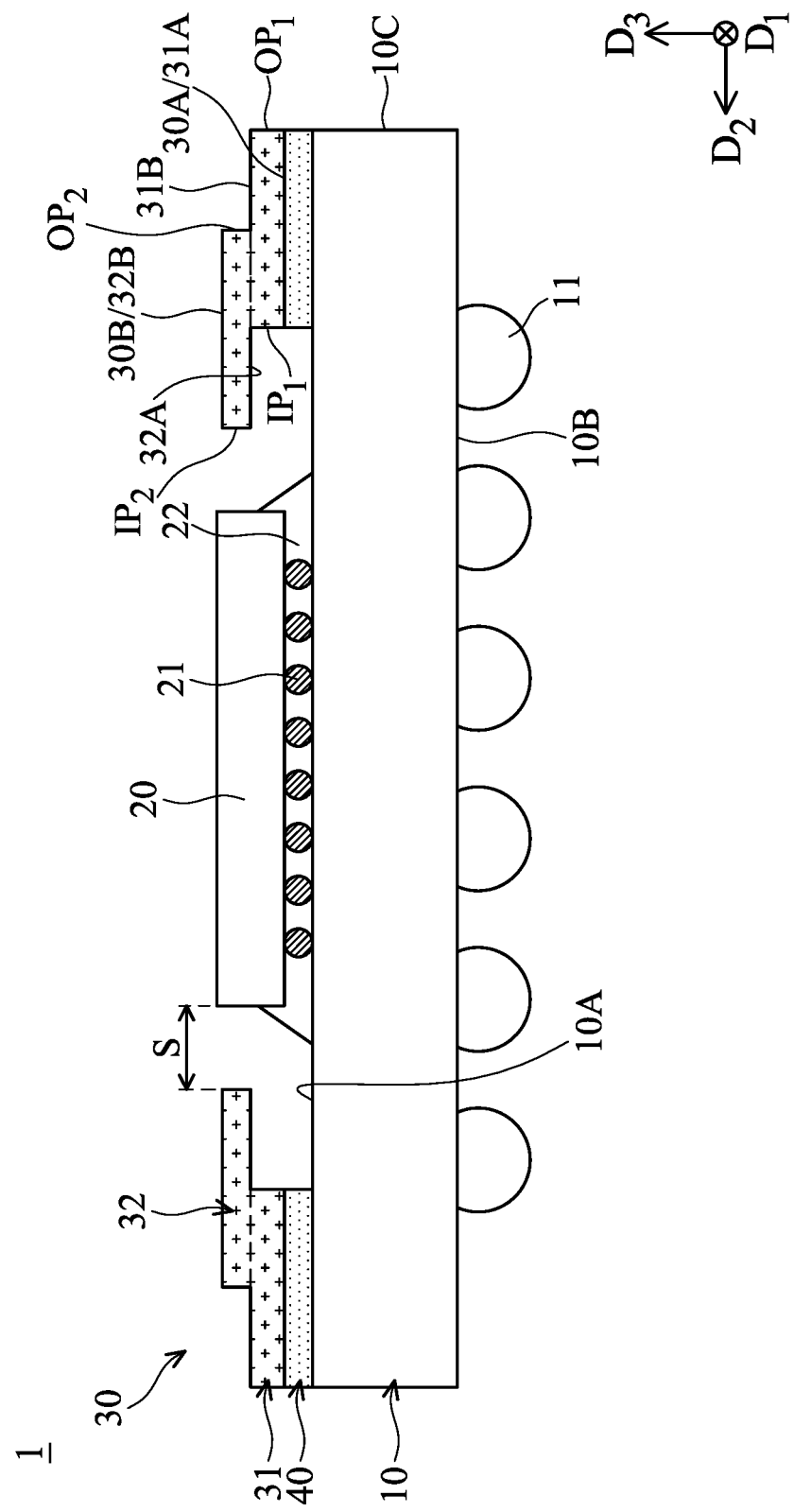
FIG. 2A is a schematic cross-sectional view of the semiconductor die package taken along line A-A' in FIG. 1.
Figure 2B:
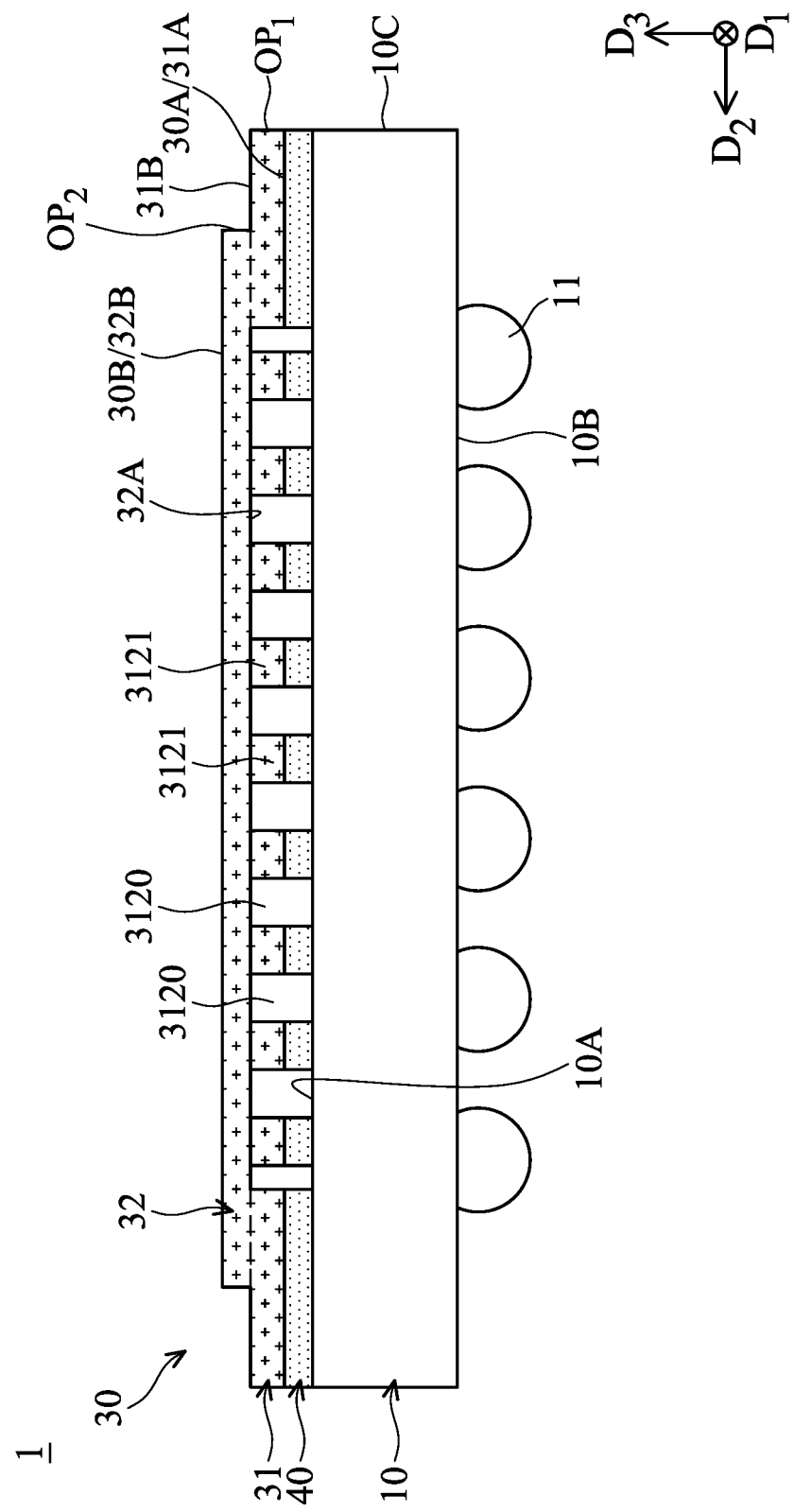
FIG. 2B is a schematic cross-sectional view of the semiconductor die package taken along line B-B' in FIG. 1.
Figure 2C:
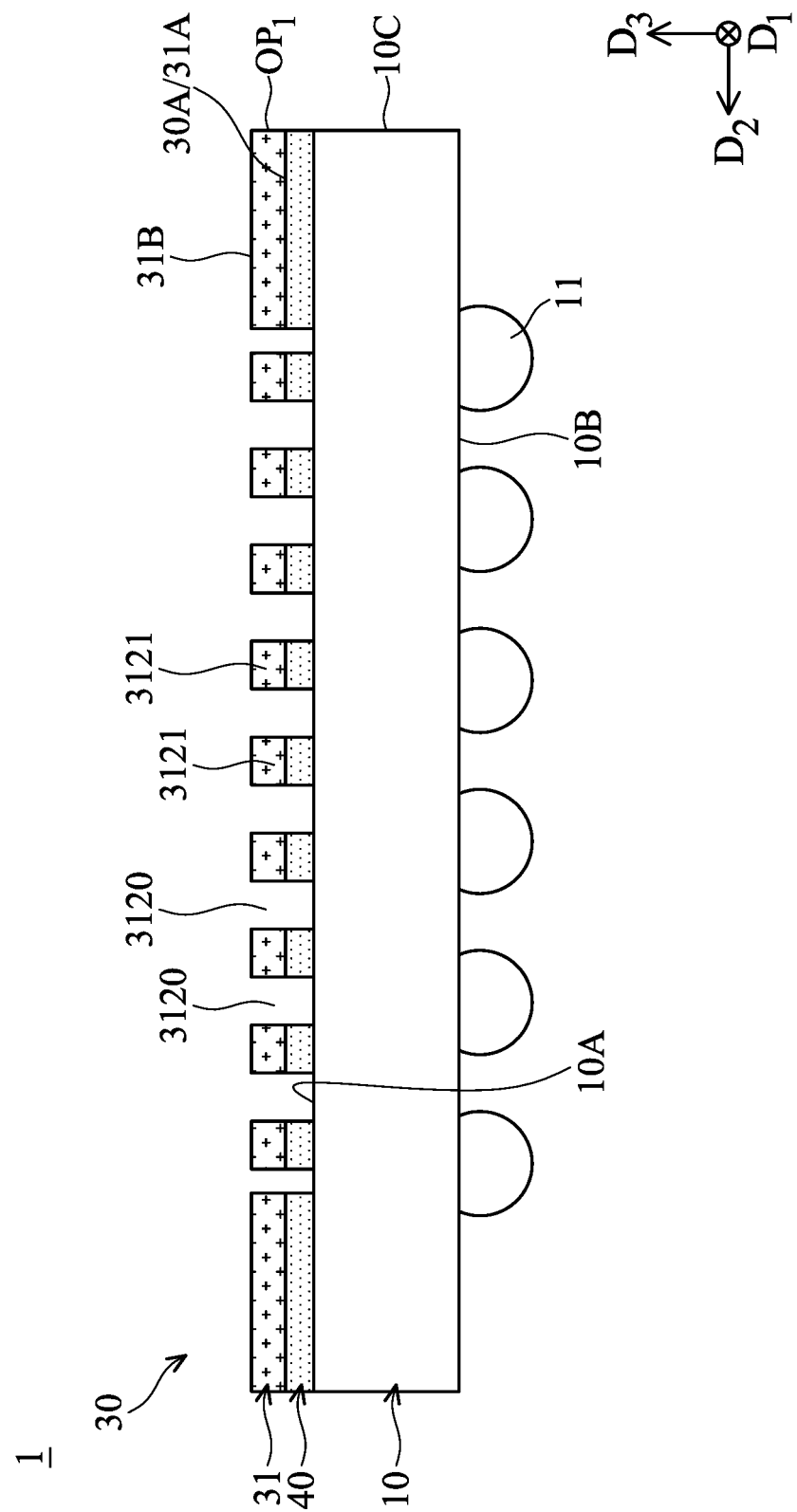
FIG. 2C is a schematic cross-sectional view of the semiconductor die package taken along line C-C' in FIG. 1.

FIG. 1 is a schematic top view of a semiconductor die package 1 in accordance with some embodiments of the disclosure. FIGS. 2A, 2B, and 2C are schematic cross-sectional views of the semiconductor die package 1 taken along line A-A', line B-B', and C-C' in FIG. 1, respectively. As shown in FIGS. 1 and 2A-2C, the semiconductor die package 1 includes a package substrate 10, a semiconductor device 20, a ring structure 30, and an adhesive layer 40. Additional features can be added to the semiconductor die package 1, and/or some of the features described below can be replaced or eliminated in other embodiments.

The package substrate 10 is used to provide electrical connection between semiconductor devices packaged in the semiconductor die package 1 and an external electronic device (not shown). In some embodiments, the package substrate 10 is a semiconductor substrate. By way of example, the material of a semiconductor substrate may include elementary semiconductor such as silicon or germanium; a compound semiconductor such as silicon germanium, silicon carbide, gallium arsenic, gallium phosphide, indium phosphide or indium arsenide; or combinations thereof. In some alternative embodiments, the package substrate 10 is a silicon-on-insulator (SOI) substrate, a germanium-on-insulator (GOI) substrate, or the like. In some other embodiments, the package substrate 10 is a printed circuit board (PCB), a ceramic substrate, or another suitable package substrate. The package substrate 10 may be a core or a core-less substrate.

In some embodiments, the package substrate 10 also has various device elements (not shown). Examples of device elements that are formed in or on the package substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. In addition, the package substrate 10 may further have one or more circuit layers (not shown) used to electrically connect the device elements and semiconductor devices that are subsequently attached.

The package substrate 10 generally has a rectangular or square shape in a top view (see FIG. 1), although other shapes may be used in different embodiments, depending on design requirements.

The package substrate 10 may have opposite surfaces 10A and 10B, which may be substantially parallel to each other. The surface 10A (the upper surface shown) may be used to receive and bond other package components of the semiconductor die package 1, which will be described further below. Several electrical connectors 11 may be provided on the surface 10B (the lower surface shown) to enable electrical connection between the semiconductor device package 1 and an external electronic device such as a PCB (not shown). The electrical connectors 11 may be or include solder balls such as tin-containing solder balls, although other suitable electrical connectors may also be used. A reflow process may be performed to bond the solder balls to the surface 10B of package substrate 10.

The semiconductor device 20 is disposed over the surface 10A of the package substrate 10. In some embodiments, the semiconductor device 20 is a functional integrated circuit (IC) die (or chip) such as a semiconductor die, and electronic die, a micro-electro-mechanical system (MEMS) die, or a combination thereof. Although not shown, the functional IC die may include a semiconductor substrate having a plurality of electronic components (e.g., transistors, diodes, passive devices, etc.) thereon to form a functional integrated circuit. The functional integrated circuit may include one or more application processors, logic circuits, memory devices, power management integrated circuits, analog circuits, digital circuits, mixed signal circuits, one or more other suitable functional integrated circuits, or a combination thereof, depending on actual needs. In some embodiments, the semiconductor device 20 is a System on a Chip (SoC) or the like. The semiconductor device 20 can be formed by various processes such as deposition, etching, implantation, photolithography, annealing, and/or other suitable processes. Two or more semiconductor devices 20 may also be arranged above the package substrate 10 in different embodiments.

Figure 5:
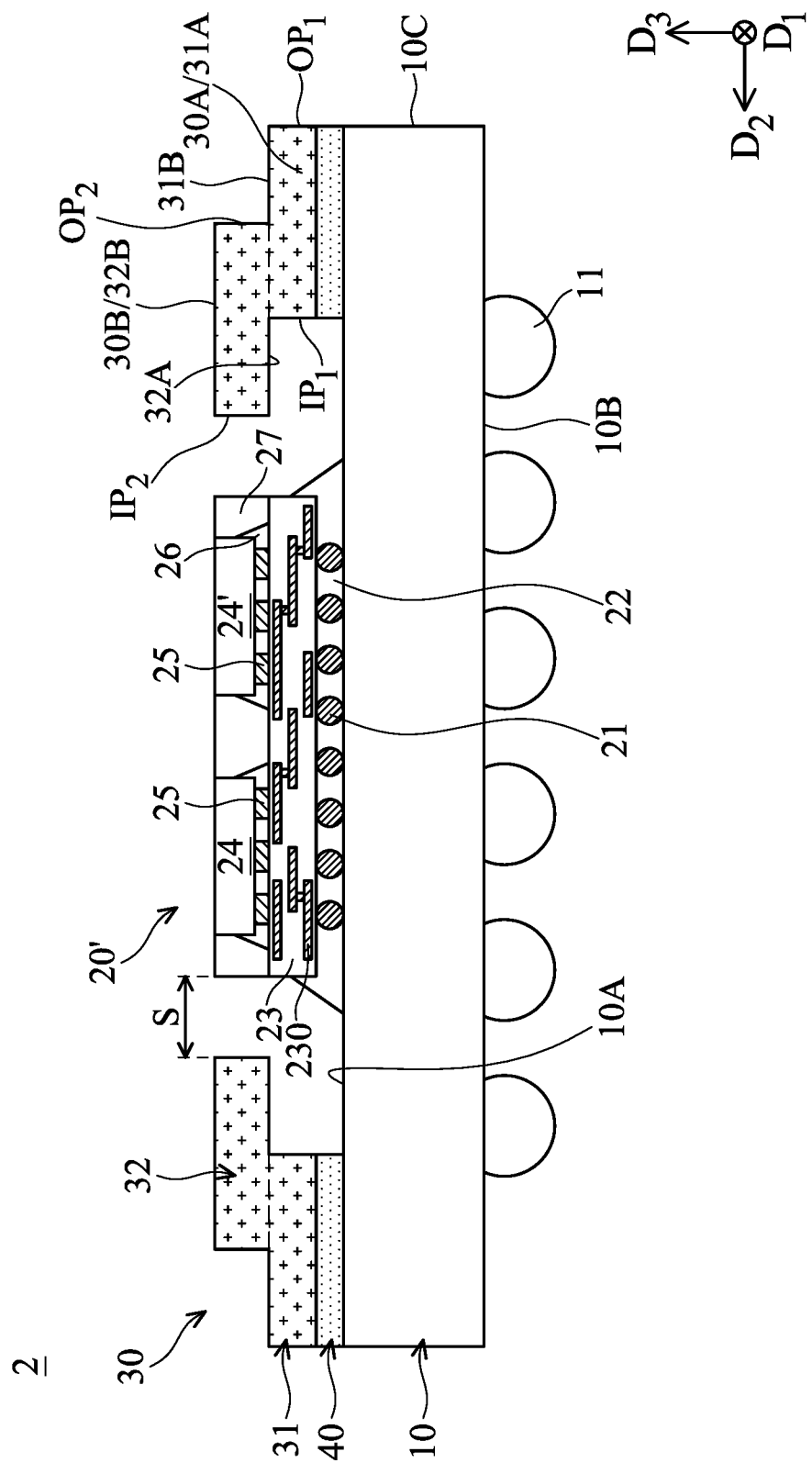
FIG. 5 is a schematic cross-sectional view of a semiconductor die package in accordance with some other embodiments.

Many variations and/or modifications can be made to embodiments of the disclosure. For example, FIG. 5 is a schematic cross-sectional view of a semiconductor die package 2 in accordance with some other embodiments, wherein the semiconductor device 20 (in FIG. 1 and FIG. 2A) is replaced with a semiconductor device 20'. In FIG. 5, the semiconductor device 20' is a package module which includes an interposer substrate 23 and semiconductor dies 24 and 24' disposed over the interposer substrate 23. Although there are two semiconductor dies 24 and 24' in this case, single die or more dies may be used in different embodiments. The semiconductor dies 24 and 24' may be two different functional IC dies, and each of the semiconductor dies 24 and 24' is the same as or similar to the semiconductor device 20 described above.

The interposer substrate 23 includes conductive features 230 therein, such as conductive lines and conductive vias (sometimes collectively referred to as a redistribution layer (RDL) structure), to electrically connect contact pads (not shown) exposed at opposite surfaces (the upper and lower surfaces shown) of the interposer substrate 23. The interposer substrate 23 may include an organic interposer substrate, a silicon interposer substrate, or the like. The materials and formation method of the interposer substrate 23 are well known in the art and therefore not described herein.

The semiconductor dies 24 and 24' may be mounted on the interposer substrate 23 through flip-chip bonding (but the disclosure is not limited thereto). For example, each of the semiconductor dies 24 and 24' is bonded onto the contact pads (not shown for simplicity) exposed at the upper surface of the interposer substrate 23 via electrical connectors 25. The electrical connectors 25 are used for electrically interconnecting the semiconductor die 24 or 24' with the interposer substrate 23. The electrical connectors 25 may include conductive pillars, solder balls, controlled collapse chip connection (C4) bumps, micro bumps, one or more other suitable bonding structures, or a combination thereof.

In some embodiments, the electrical connectors 25 may be made of or include a metal material, such as copper, aluminum, gold, nickel, silver, palladium, or the like, or a combination thereof. The electrical connectors 25 may be formed using an electroplating process, an electroless plating process, a placement process, a printing process, a physical vapor deposition (PVD) process, a chemical vapor deposition (CVD) process, a photolithography process, one or more other applicable processes, or a combination thereof.

In some other embodiments, the electrical connectors 25 may be made of a tin-containing material. The tin-containing material may further include copper, silver, gold, aluminum, lead, one or more other suitable materials, or a combination thereof. In some other embodiments, the electrical connectors 25 are lead-free. A reflow process may be performed in order to shape the tin-containing material into the desired bump or ball shapes.

An underfill layer 26 is also formed to surround and protect the electrical connectors 25, and enhances the connection between the semiconductor dies 24 and 24' and the interposer substrate 23, in accordance with some embodiments. The underfill layer 26 may be made of or include an insulating material such as an underfill material. The underfill material may include an epoxy, a resin, a filler material, a stress release agent (SRA), an adhesion promoter, another suitable material, or a combination thereof.

In some embodiments, an underfill material in liquid state is dispensed into the gap between each semiconductor die 24/24' and the interposer substrate 23 to reinforce the strength of the electrical connectors 25 and therefore the overall package structure. After the dispensing, the underfill material is cured to form the underfill layer 26. In some alternative embodiments, the underfill layer 26 is omitted.

A molding layer 27 is further formed over the interposer substrate 23 to surround and protect the semiconductor dies 24 and 24' and the underfill element 26, in accordance with some embodiments. The molding layer 27 may be separated from the electrical connectors 25 below the semiconductor dies 24 and 24' by the underfill element 26, in some embodiments. The molding layer 27 may be made of or include an insulating material such as a molding material. The molding material may include a polymer material, such as an epoxy-based resin with fillers dispersed therein.

In some embodiments, a molding material (such as a liquid molding material) 27 is dispensed over the interposer substrate 23 and over the semiconductor dies 24 and 24'. A thermal process is then used to cure the liquid molding material and to transform it into the molding layer 27. In some embodiments, top surfaces of the semiconductor dies 24 and 24' are exposed from the molding layer 27 through a planarization process (such as a chemical mechanical polishing (CMP) process). In some alternative embodiments, the molding layer 27 is omitted.

As shown in FIGS. 2A and 5, after being manufactured, the semiconductor device 20 (FIG. 2A) or 20' (FIG. 5) may be mounted on a die mounting region (not shown) of the package substrate 10 through flip-chip bonding (but the disclosure is not limited thereto). For example, the semiconductor device 20 or 20' is bonded onto the contact pads (not shown for simplicity) exposed at the surface 10A of the package substrate 10 via electrical connectors 21. The electrical connectors 21 are used for electrically interconnecting the semiconductor device 20 or 20' with the package substrate 10. The electrical connectors 21 may include conductive pillars, solder balls, controlled collapse chip connection (C4) bumps, micro bumps, one or more other suitable bonding structures, or a combination thereof. The materials and formation method of the electrical connectors 21 may be the same as or similar to those of the electrical connectors 25 described above, and are not repeated here. An underfill layer 22 (similar to the underfill layer 26) may also be formed to surround and protect the electrical connectors 21.

In some other embodiments, there are other package components such as device elements (active devices and/or passive devices), dummy dies, or the like, or a combination thereof arranged and mounted on the package substrate 10, depending on actual needs. The dummy dies may be provided to improve the consistency of the entire package structure and reduce warpage. The dummy dies may be made of silicon, a dielectric material, a metal material such as copper or stainless steel, the like, or a combination thereof. In some embodiments, the dummy dies are blank dies, with the entirety formed of a homogeneous material such as silicon. No active devices, passive devices, functional circuitry, or the like are formed in the dummy dies, so the dummy dies do not have electrical functions, in some embodiments. In some alternative embodiments, the dummy dies are defective active dies that have been recycled as dummy dies.

The ring structure 30 is disposed over the surface 10A of the package substrate 10. The ring structure 30 may have a bottom surface 30A and a top surface 30B, which are substantially opposite and parallel to each other, and the bottom surface 30A faces the surface 10A. In some embodiments, the ring structure 30 is arranged along and adjacent to the periphery 10C of the package substrate 10, and laterally surrounds the semiconductor device 20 (or 20'). The ring structure 30 may have a substantially rectangular or square ring shape in a top view (see FIG. 1), depending on the shape of the package substrate 10. The ring structure 30 may have a rigidity greater than that of the package substrate 10, and therefore may be configured as a stiffener ring for constraining the package substrate 10 to alleviate its warpage and/or to enhance robustness of the package substrate 10. The material of the ring structure 30 may include metal such as copper, stainless steel, stainless steel/Ni, or the like, but is not limited thereto.

The adhesive layer 40 is interposed between the surface 10A of the package substrate 10 and the bottom surface 30A of the ring structure 30. The adhesive layer 40 is configured to bond or adhere the ring structure 30 to the package substrate 10. The adhesive layer 40 may be any suitable non-conductive adhesive, die attach film (DAF), or the like. In some embodiments, the adhesive layer 40 may be made of or include an organic adhesive material such as epoxy, polyimide (PI), polybenzoxazole (PBO), benzo-cyclobutene (BCB), but the disclosure is not limited thereto. Before installing the ring structure 30, the adhesive layer 40 may be applied to the bottom surface 30A of the ring structure 30 or may be applied over the surface 10A of the package substrate 10, in some embodiments.

The above-mentioned various package components and substrate materials used in the semiconductor die package 1 or 2 may have different coefficients of thermal expansion (CTEs). Hence, when the package undergoes thermal cycling during package assembly, reliability testing, or field operation, the package components and substrate materials may expand at different rates, causing the package substrate 10 tends to warp. The ring structure 30 may reduce some extent this warpage, but since the ring structure 30 constrains the package substrate 10, this constraining force also generates stress in the package substrate 10 and other package components (such as the semiconductor device 20 or 20') on the package substrate 10, and may cause damage (for example, cracking or delamination) to them.

Figure 3:
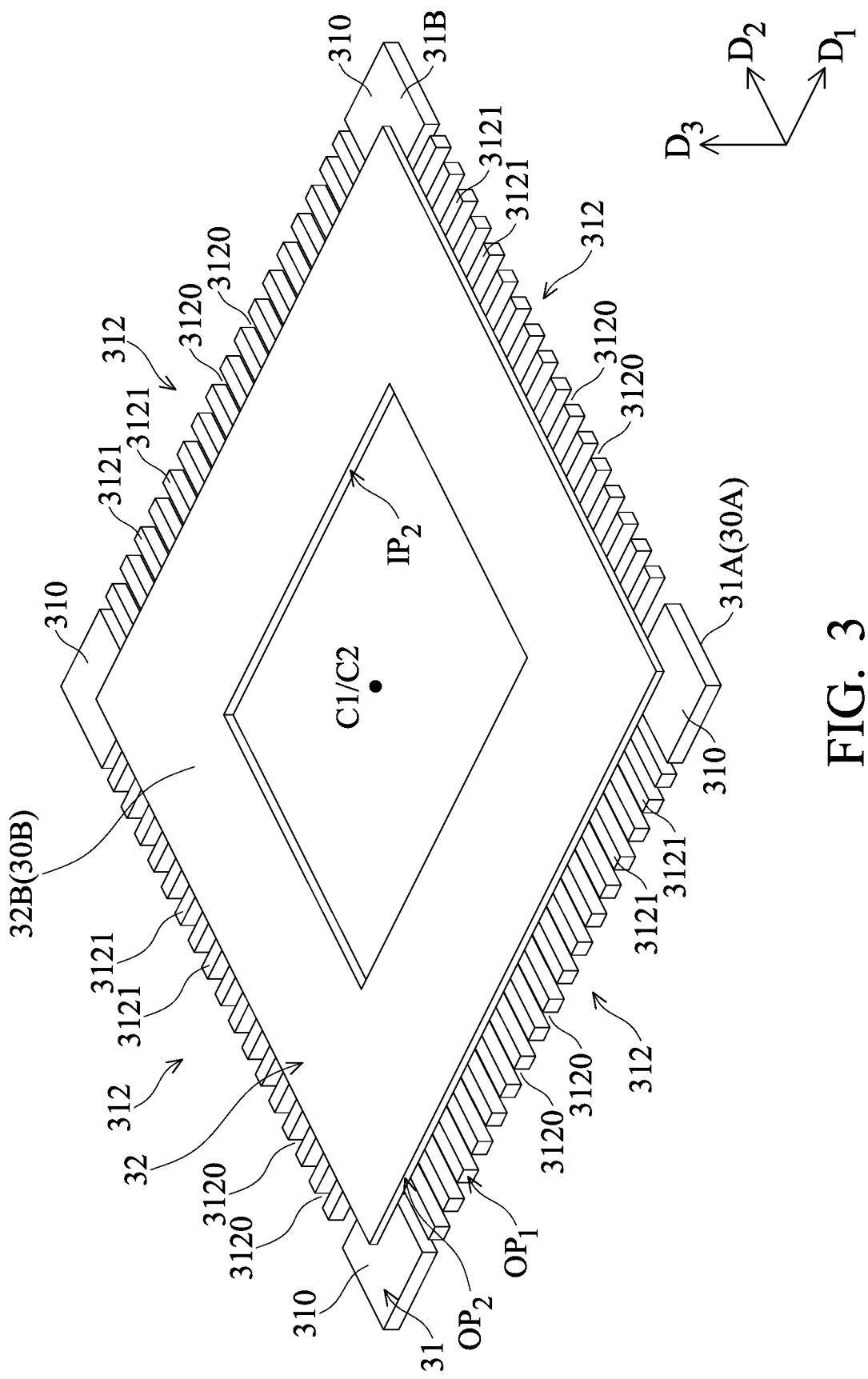
FIG. 3 is a perspective view of a ring structure in accordance with some embodiments.
Figure 4:
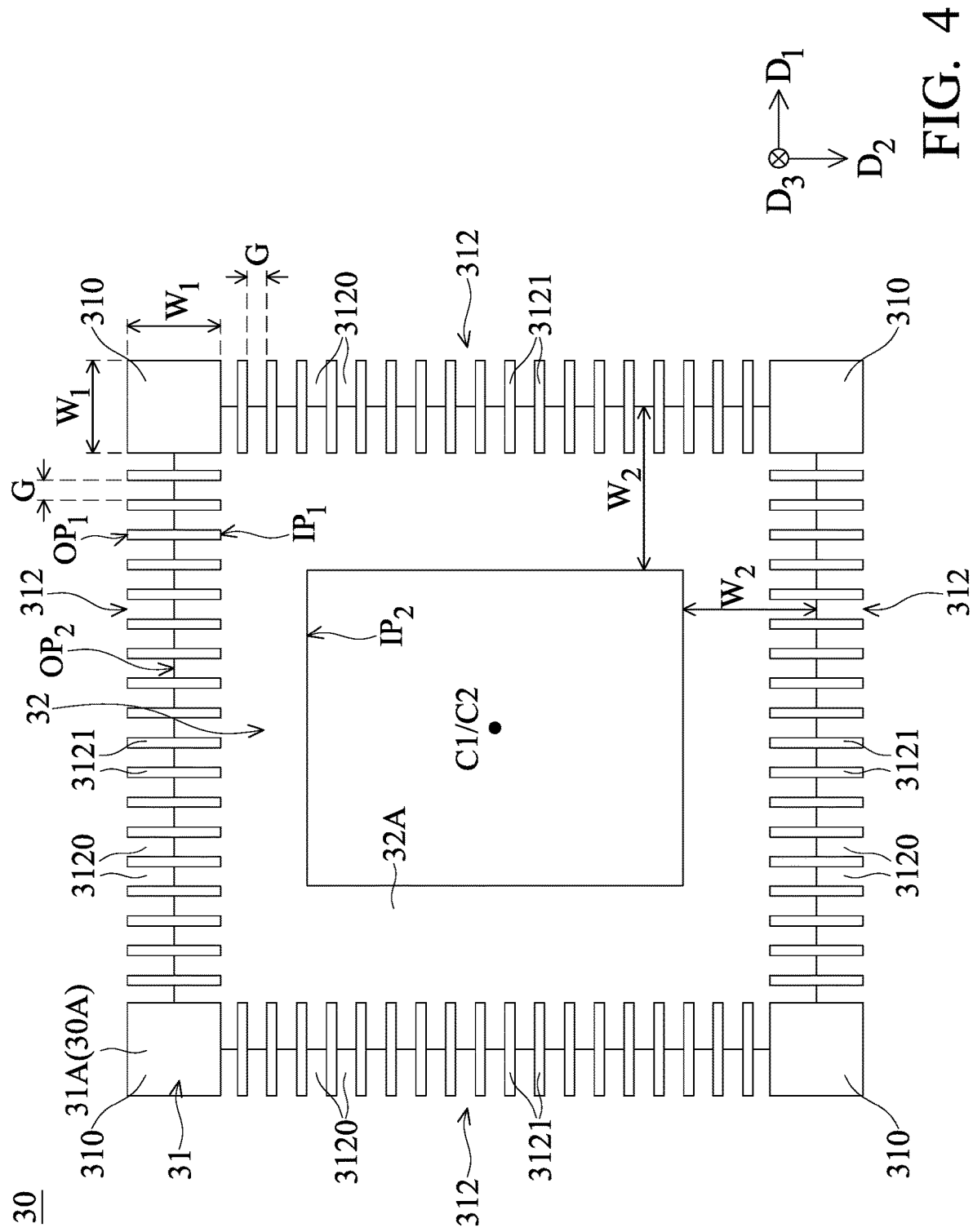
FIG. 4 is a schematic bottom view of the ring structure in FIG. 3.

Therefore, what is needed is a semiconductor die package having a ring structure that can address the above issue of stress. The following will describe a novel ring structure according to some embodiments that can be used to relieve stress generated in the package during thermal cycling without losing its ability to control warpage. FIG. 3 is a perspective view of a ring structure 30 in accordance with some embodiments, and FIG. 4 is a schematic bottom view of the ring structure 30 in FIG. 3. The ring structure 30 in FIGS. 3 and 4 can be applied to the semiconductor die package 1 or 2 described above to better control stress and warpage.

As shown in FIGS. 1 to 5, the ring structure 30 includes a lower ring portion 31 and an upper ring portion 32 above the lower ring portion 31. In these embodiments, the lower ring portion 31 and the upper ring portion 32 are integrally formed (that is, the ring structure 30 is an one-piece ring structure), although the lower ring portion 31 and the upper ring portion 32 may be originally separate elements and may be joined together by an adhesive in different embodiments.

When the ring structure 30 is attached to the package substrate 10, the lower ring portion 31 is interposed between the surface 10A of the package substrate 10 and the upper ring portion 32. In some embodiments, the lower ring portion 31 is a flat structure and has opposite surfaces 31A and 31B which may be substantially parallel to each other. The surface 31A (the bottom surface shown, which is also the bottom surface 30A of the ring structure 30) faces the surface 10A of the package substrate 10. The adhesive layer 40 is interposed between the surface 31A and the surface 10A, and is used to bond the ring structure 30 to the package substrate 10.

In some embodiments, the lower ring portion 31 is arranged along and adjacent to the periphery 10C of the package substrate 10, and laterally surrounds the semiconductor device 20 or 20'. The lower ring portion 31 may have a substantially rectangular or square ring shape in a top view (see FIG. 1), depending on the shape of the package substrate 10. For example, the rectangular lower ring portion 31 includes four corners 310 and four sides 312, each side 312 being between two adjacent corners 310 (or each corner 310 being at an intersection of two adjacent sides 312), and the corners 310 and the sides 312 correspond to the corners and sides of the rectangular package substrate 10, respectively.

In some embodiments, as shown in FIG. 4, the entire lower ring portion 31 (i.e., all the sides 312) has a uniform width $W_1$, but the disclosure is not limited thereto. In some alternative embodiments, the width of the sides 312 (such as the upper and lower sides shown) of the lower ring portion 31 arranged in a first direction $D_1$ may be different from (larger or smaller than) the width of the sides 312 (such as the left and right sides shown) of the lower ring portion 31 arranged in a second direction $D_2$. The size (area) of each corner 310 is defined by widths $W_1$ of the adjoined sides 312. The widths $W_1$ of the sides and the dimensions/shape of the corners 310 can be changed depending on actual needs (e.g., the dimensions and/or shape of the package substrate 10), and the width $W_1$ is more than zero.

In some embodiments, several notches 3120 (also referred to as "eliminated parts") are formed on the sides 312 of the lower ring portion 31, but not at the corners 310 of the lower ring portion 31. Each notch 3120 is configured to penetrate the surfaces 31A and 31B (the bottom and top surfaces shown) of the lower ring portion 31. The notches 3120 can be formed using a mechanical process such as a punching process, a chemical process such as an etching process, laser ablation, or the like.

In some embodiments, the notches 3120 are formed along the outer periphery $OP_1$ of the lower ring portion 31. For example, the notches 3120 may extend from the outer periphery $OP_1$ (adjacent to the periphery 10C of the package substrate 10) of the lower ring portion 31 to the inner periphery $IP_1$ (adjacent to the semiconductor device 20 or 20') of the lower ring portion 31 located below the upper ring portion 32, as shown in FIG. 4. As such, the lower ring portion 31 includes a plurality of solid columns 3121 and the notches 3120, and each notch 3120 is interposed between adjacent solid columns 3121 or between adjacent solid column 3121 and corner 310.

Figure 4A:
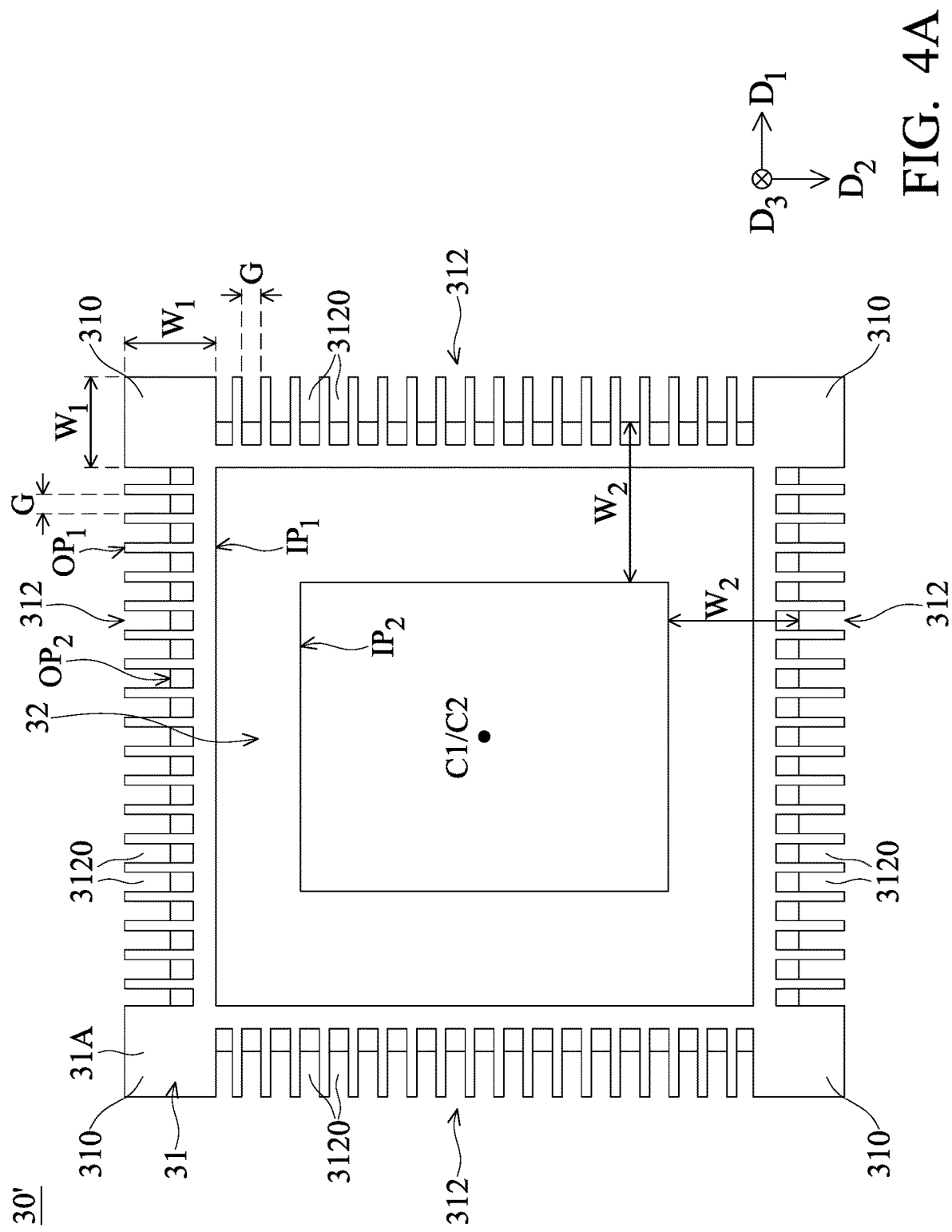
FIG. 4A is a schematic bottom view of a ring structure in accordance with some other embodiments.
Figure 4B:
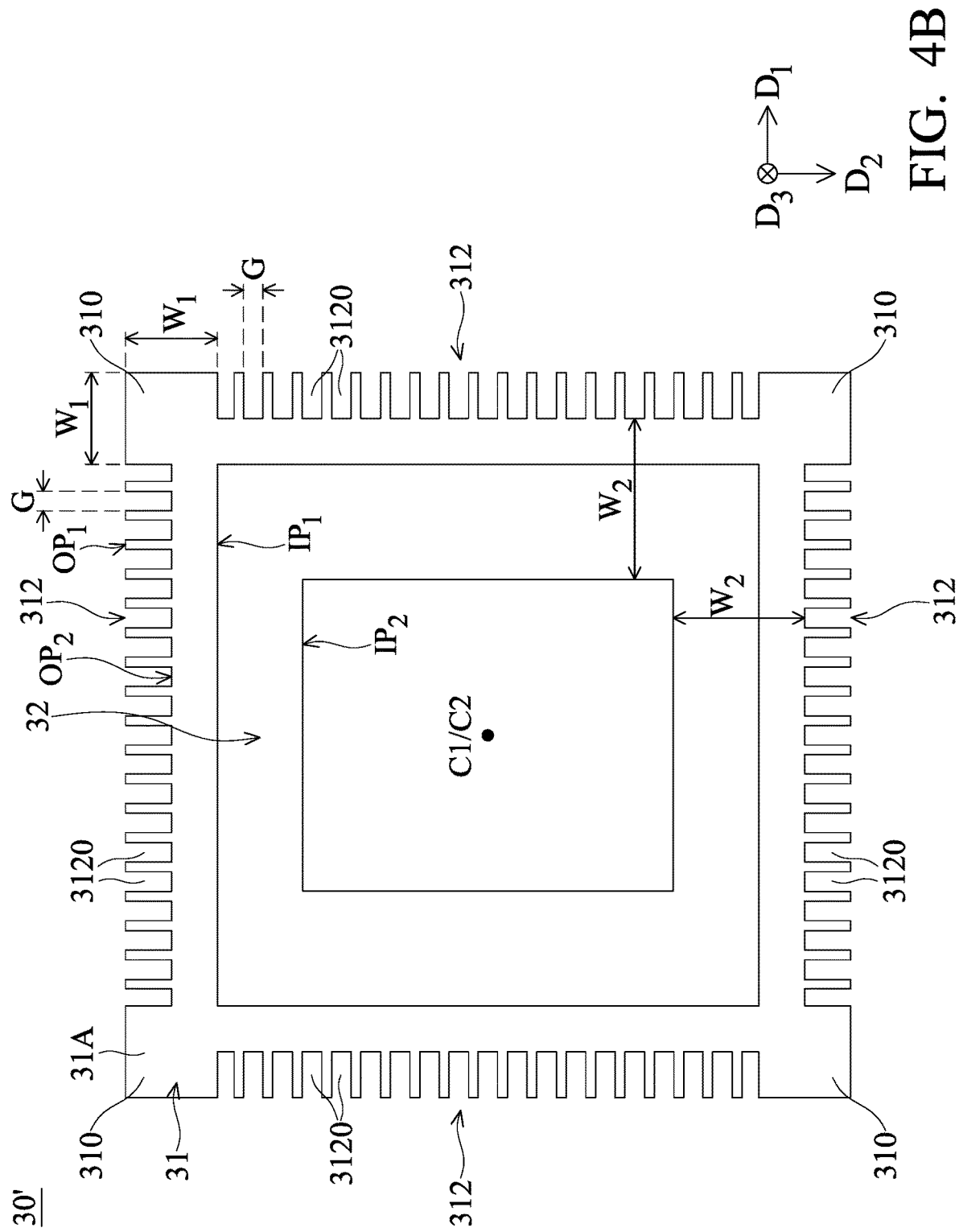
FIG. 4B is a schematic bottom view of a ring structure in accordance with some other embodiments.

FIG. 4A and FIG. 4B are schematic bottom views of a ring structure 30' in accordance with some alternative embodiments. In FIG. 4A and FIG. 4B, each notch 3120 is formed to extend from the outer periphery $OP_1$ of the lower ring portion 31 toward the inner periphery $IP_1$ of the lower ring portion 31, but does not reach (penetrate) the inner periphery $IP_1$. In some embodiments, the notches 3120 may or may not extend to the bottom of the upper ring portion 32. For example, the boundary including the inner edge of each notch 3120 of the lower ring portion 31 may be inside (FIG. 4A), outside, or aligned with (FIG. 4B) the outer periphery $OP_2$ of the upper ring portion 32 in a plan view. Other features of the ring structure 30' may be similar to those of the ring structure 30 illustrated in FIG. 4.

In some embodiments, each notch 3120 (or each solid column 3121) extends in a direction (such as the direction $D_1$ or $D_2$ shown in the figure) perpendicular to the extending direction (such as the direction $D_2$ or $D_1$ shown in the figure) of the respective side 312 of the lower ring portion 31, but embodiments of the disclosure are not limited thereto (which will be further described later). In some embodiments, all the notches 3120 of the lower ring portion 31 may have a uniform size G and may be arranged in equal intervals, but embodiments of the disclosure are not limited thereto (which will be further described later).

The upper ring portion 32 is integrally formed on the surface 31B (the top surface shown) of the lower ring portion 31. In some embodiments, the upper ring portion 32 is a flat structure, and has surfaces 32A and 32B which may be substantially parallel to each other. The surface 32A (the bottom surface shown) faces and is connected to the surface 31B of the lower ring portion 31, and the surface 32B (the top surface shown, which is also the top surface 30B of the ring structure 30) is opposite to the surface 32A.

In some embodiments, the upper ring portion 32 concentrically covers the lower ring portion 31. For example, the upper ring portion 32 and the lower ring portion 31 may have the same shape (for example, a rectangular or square ring shape), and the center $C_2$ of the upper ring portion 32 is aligned with the center $C_1$ of the lower ring portion 31, as shown in FIGS. 3 and 4. In some embodiments, as shown in FIG. 4, the entire upper ring portion 32 (i.e., all the sides thereof) has a uniform width $W_2$, but the disclosure is not limited thereto.

In some embodiments, the outer periphery $OP_2$ of the upper ring portion 32 is spaced apart from the outer periphery $OP_1$ of the lower ring portion 31, and a part of the (top) surface 31B of the lower ring portion 31 (and a part of the notches 1320) is exposed from the upper ring portion 32, when viewed in a vertical direction (such as the direction $D_3$ shown in the figures, that is perpendicular to the surface 10A of the package substrate 10), for example.

In addition, the upper ring portion 32 has a (protruding or overhang) part extending laterally inwardly toward the semiconductor device 20 or 20' and beyond the inner periphery $IP_1$ of the lower ring portion 31, in some embodiments. As such, the inner periphery $IP_2$ of the upper ring portion 32 is closer to the semiconductor device 20 or 20' than the inner periphery $IP_1$ of the lower ring portion 31. In some embodiments, the inner periphery $IP_2$ of the upper ring portion 32 laterally surrounds the semiconductor device 20 or 20', and a gap S is formed between the inner periphery $IP_2$ of the upper ring portion 32 and the semiconductor device 20 or 20', when viewed in the vertical direction (such as the direction $D_3$ shown in the figures), as shown in FIG. 1.

In some embodiments, the (bottom) surface 32A of the protruding (or overhang) part of the upper ring portion 32 is spaced apart from the (upper) surface 10A of the package substrate 10, and is separated from the adhesive layer 40 (i.e., the adhesive layer 40 is not formed on the surface 32A of the upper ring portion 32), as shown in FIGS. 2A and 5.

With the above design, the ring structure 30 (or 30') can reduce stress generated in the package (including the package substrate 10 and other package components thereon) during thermal cycling through the notches 3120 formed on the sides 312 of the lower ring portion 31. This is due to a reduction of the coupling effect between the notches 3120 (eliminated parts) and the package substrate 10. In addition, the corners 310 of the lower ring portion 31 are left (that is, no notches 3120 are formed at the corners 310), and the upper ring portion 32 is formed above the lower ring portion 31, helping maintain or increase the structural strength of the entire ring structure 30 (or 30'), which also helps to control warpage of the package substrate 10. Accordingly, the ring structure 30 (or 30') has better ability to control warpage and stress, and the reliability of the entire package structure is also improved.

Many variations and/or modifications can be made to embodiments of the disclosure. For example, FIGS. 6A-6F and 7A-7F schematically show bottom views of ring structures (30-1, 30-2, 30-3, 30-4, 30-5, and 30-6) with different notch configurations in accordance with some embodiments, and also schematically show various arrangements of the adhesive layer 40 (marked by dots). It should be understood that the ring structures shown in FIGS. 6A-6F correspond to the ring structures shown in FIGS. 7A-7F, respectively, and the difference lies in the placement of the adhesive layer 40.

Figure 6A:
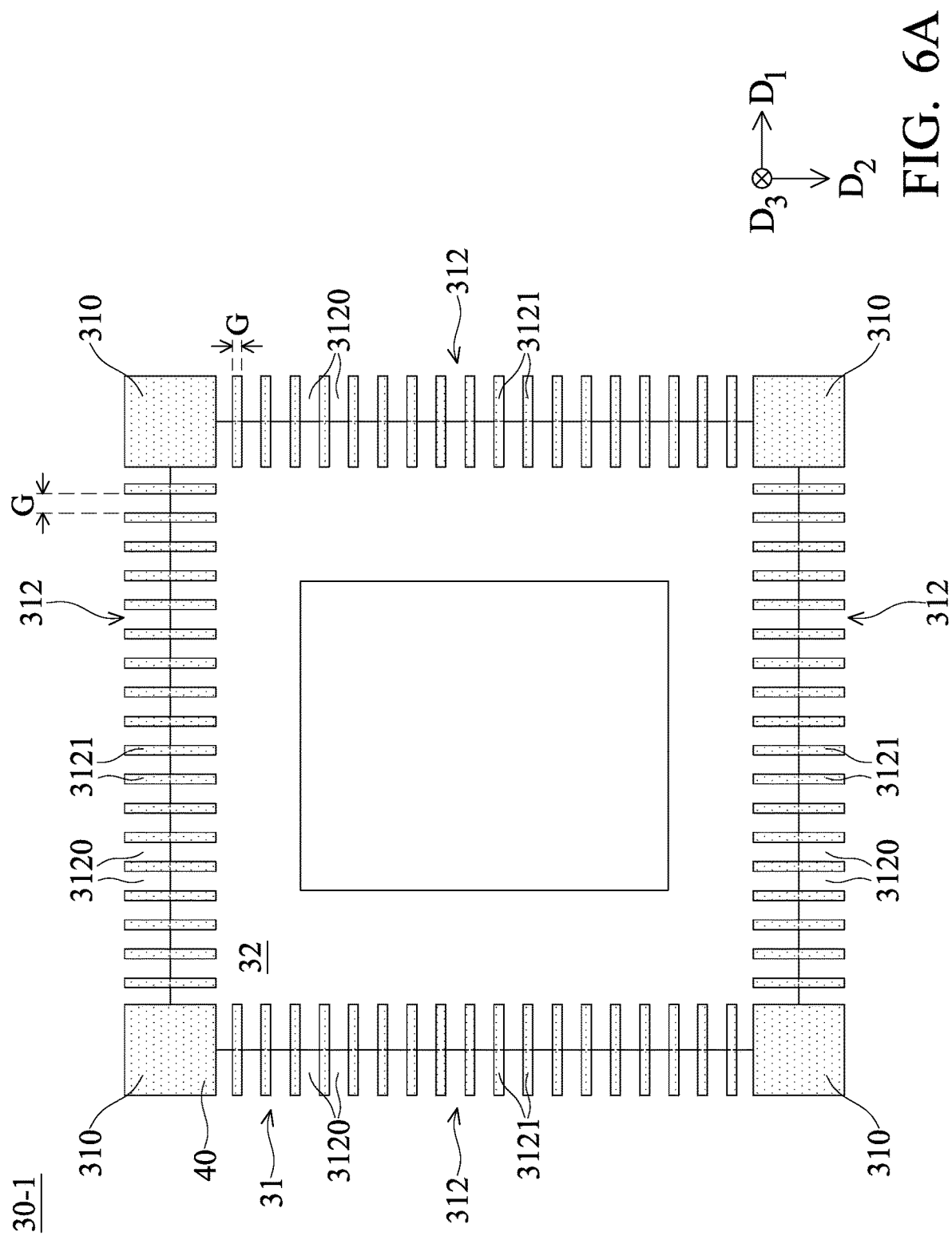
FIG. 6A schematically shows a bottom view of a ring structure with an adhesive layer arranged thereon in accordance with some embodiments.
Figure 7A:
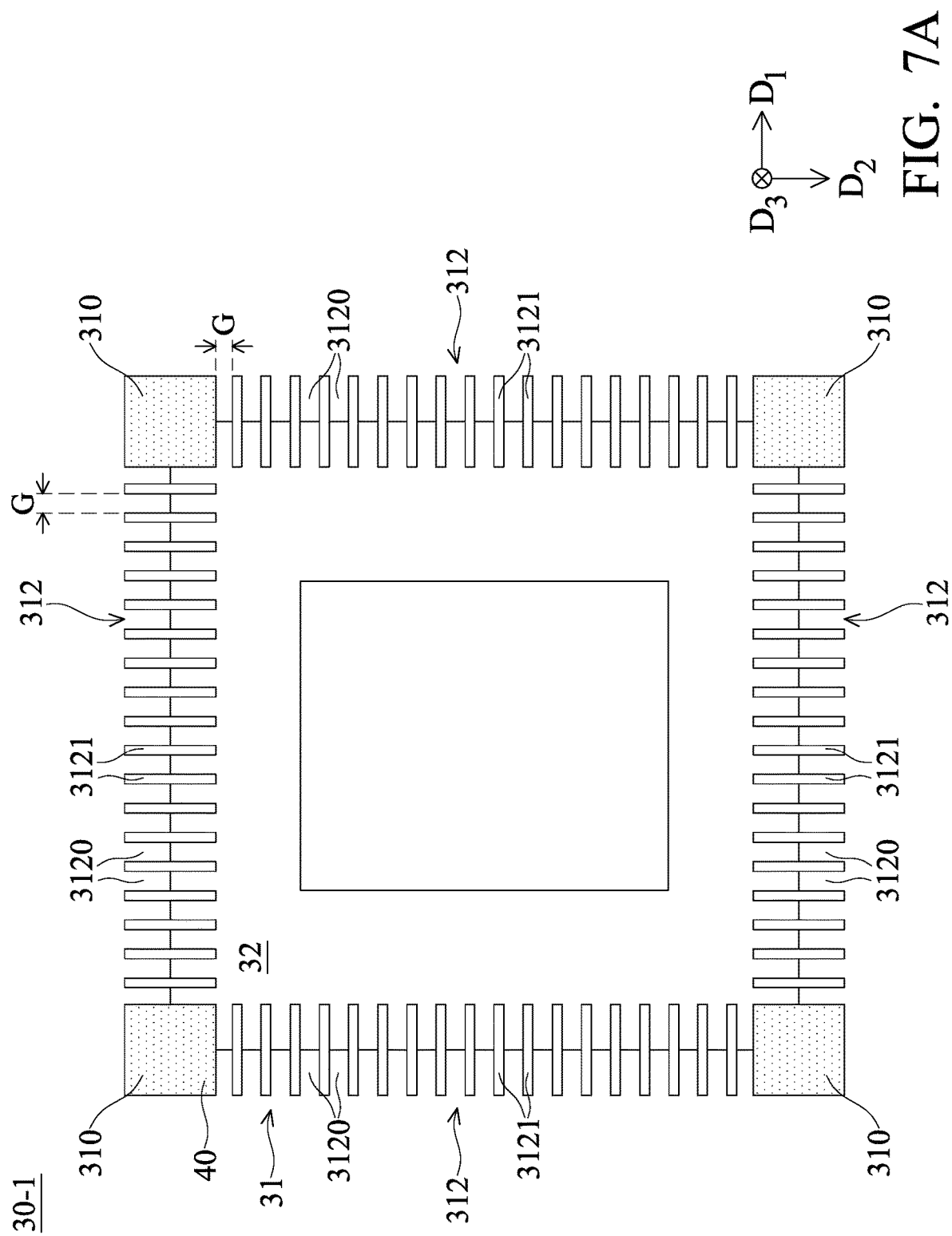
FIG. 7A schematically shows a bottom view of a ring structure with an adhesive layer arranged thereon in accordance with some embodiments.

In FIG. 6A and FIG. 7A, the illustrated ring structure 30-1 has the same notch configuration (for example, the notches 3120 arranged on the sides 312 of the lower ring portion 31 may have a uniform size G and may be arranged in equal intervals) as the ring structure 30 illustrated in FIG. 4. The adhesive layer 40 may be formed at the four corners 310 and the solid columns 3121 (between the notches 3120) of the lower ring portion 31 (see FIG. 6A), or may be formed only at the four corners 310 of the lower ring portion 31 (see FIG. 7A).

Figure 6B:
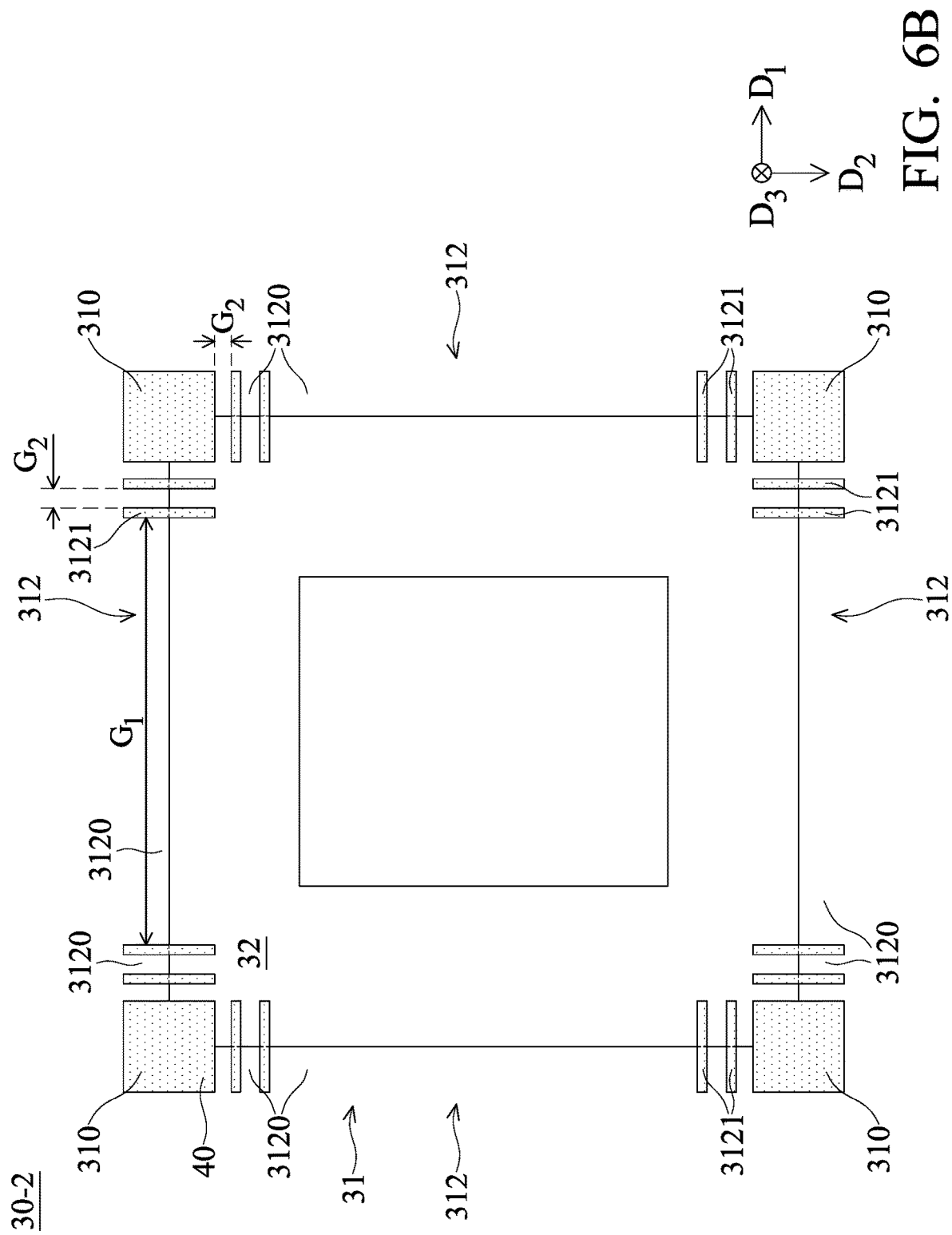
FIG. 6B schematically shows a bottom view of a ring structure with an adhesive layer arranged thereon in accordance with some embodiments.
Figure 7B:
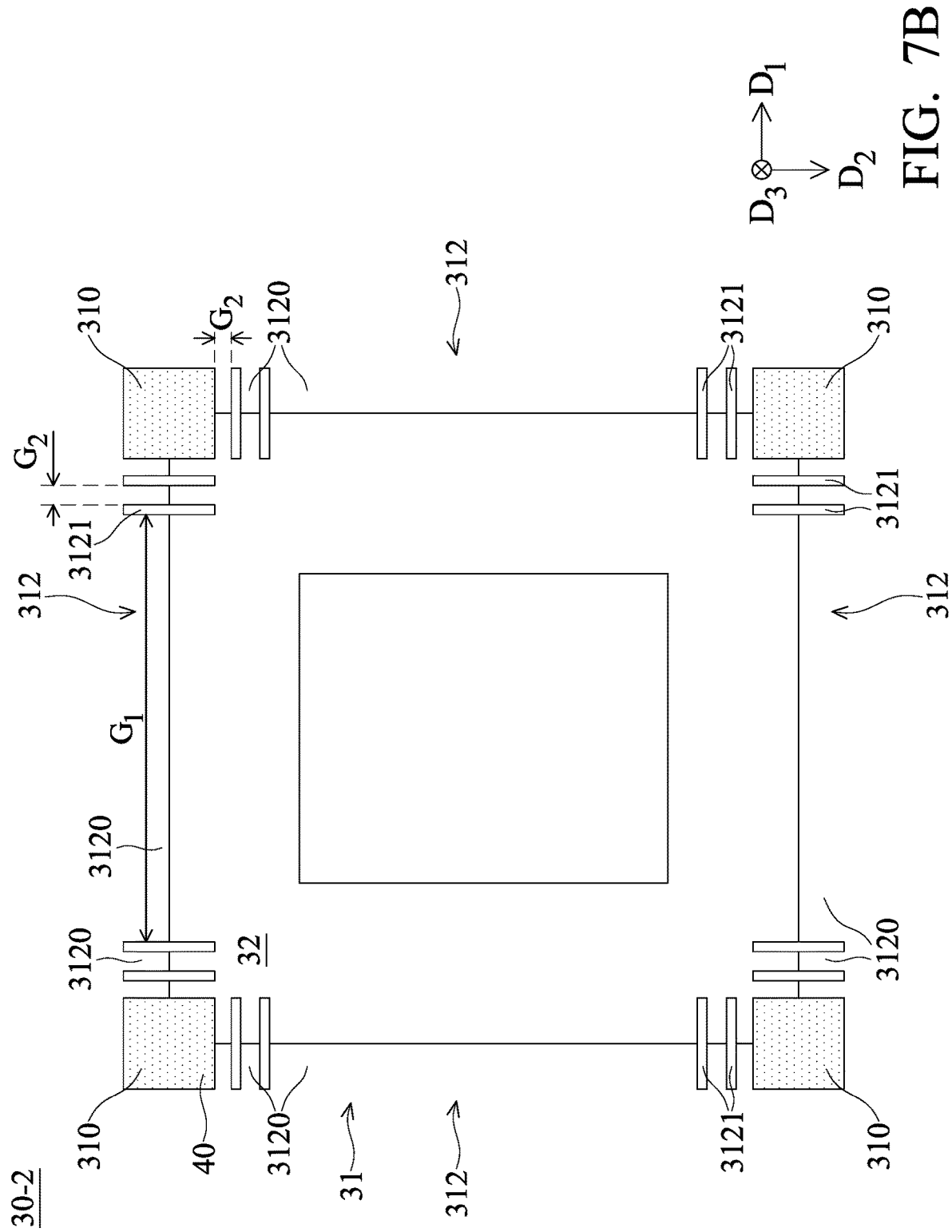
FIG. 7B schematically shows a bottom view of a ring structure with an adhesive layer arranged thereon in accordance with some embodiments.

In FIG. 6B and FIG. 7B, for each side 312 of the lower ring portion 31, the notches 3120 arranged therein may have two or more different sizes, for example, the size G1 of the notch 3120 arranged at the center may be larger than the size G2 of the notches 3120 arranged near the corners 310. The adhesive layer 40 may be formed at the four corners 310 and the solid columns 3121 (between the notches 3120) of the lower ring portion 31 (see FIG. 6B), or may be formed only at the four corners 310 of the lower ring portion 31 (see FIG. 7B).

Figure 6C:
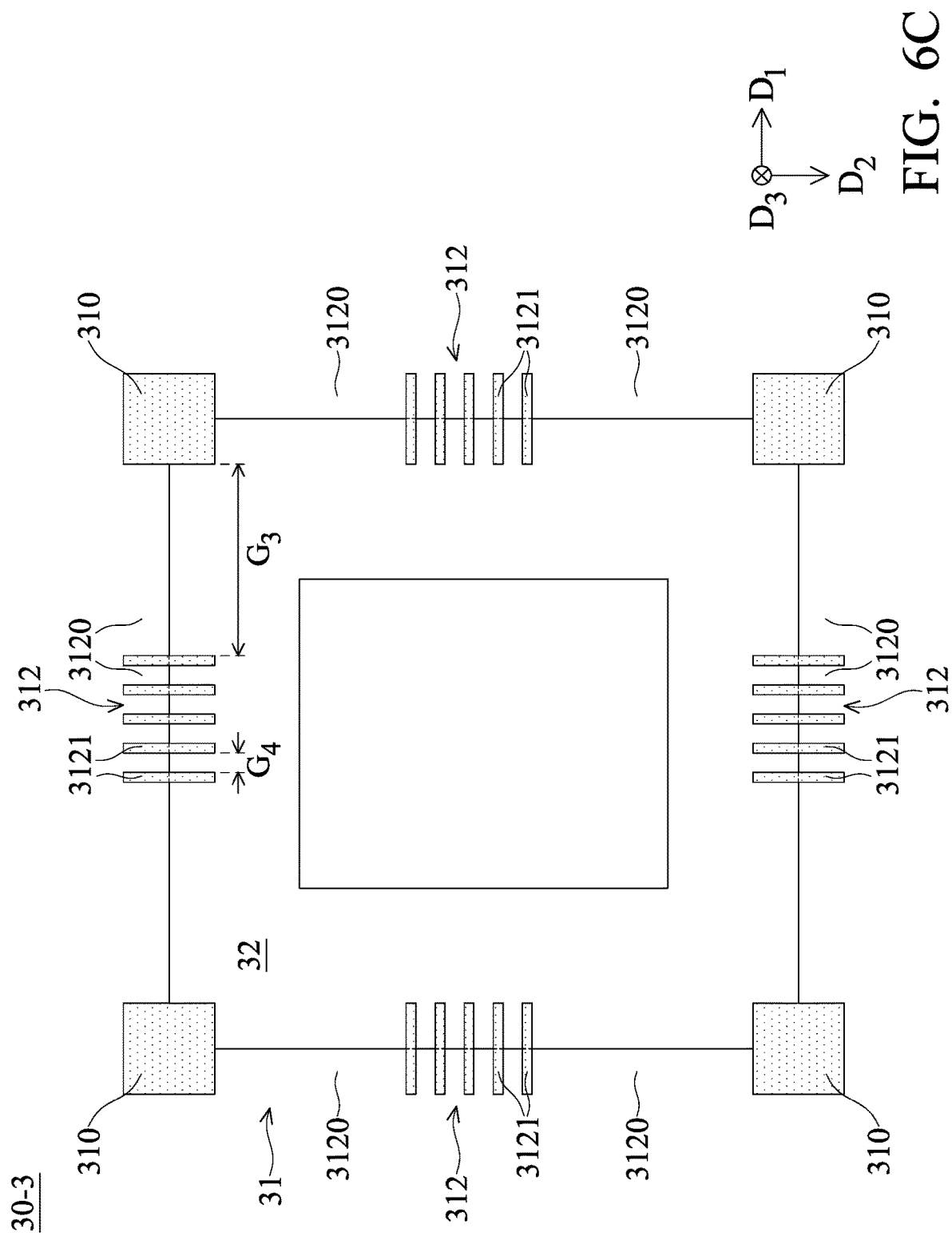
FIG. 6C schematically shows a bottom view of a ring structure with an adhesive layer arranged thereon in accordance with some embodiments.
Figure 7C:
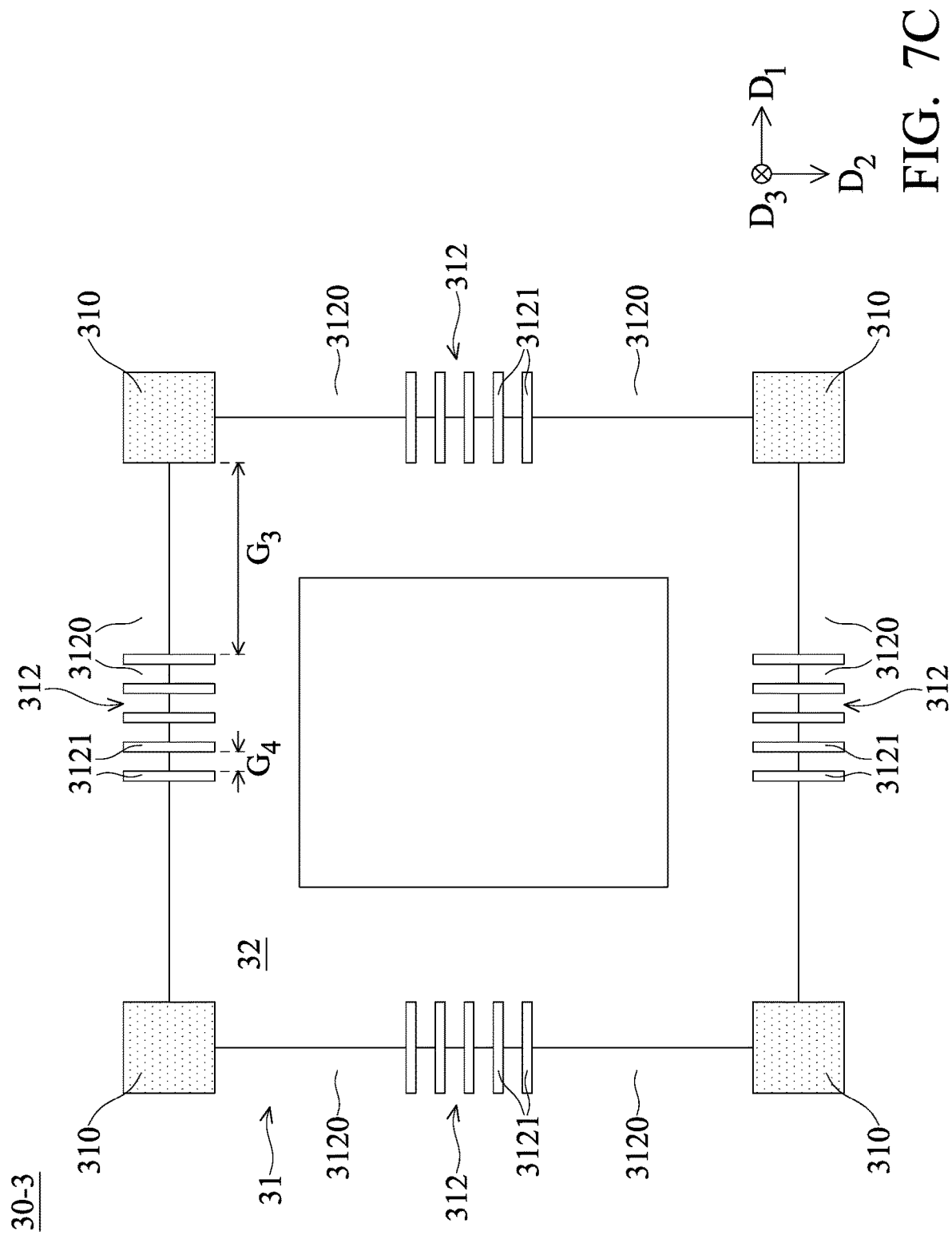
FIG. 7C schematically shows a bottom view of a ring structure with an adhesive layer arranged thereon in accordance with some embodiments.

In FIG. 6C and FIG. 7C, for each side 312 of the lower ring portion 31, the notches 3120 arranged therein may have two or more different sizes, for example, the size G3 of the notches 3120 arranged near the corners 310 may be larger than the size G4 of the notches 3120 arranged at the center. The adhesive layer 40 may be formed at the four corners 310 and the solid columns 3121 (between the notches 3120) of the lower ring portion 31 (see FIG. 6C), or may be formed only at the four corners 310 of the lower ring portion 31 (see FIG. 7C).

Figure 6D:
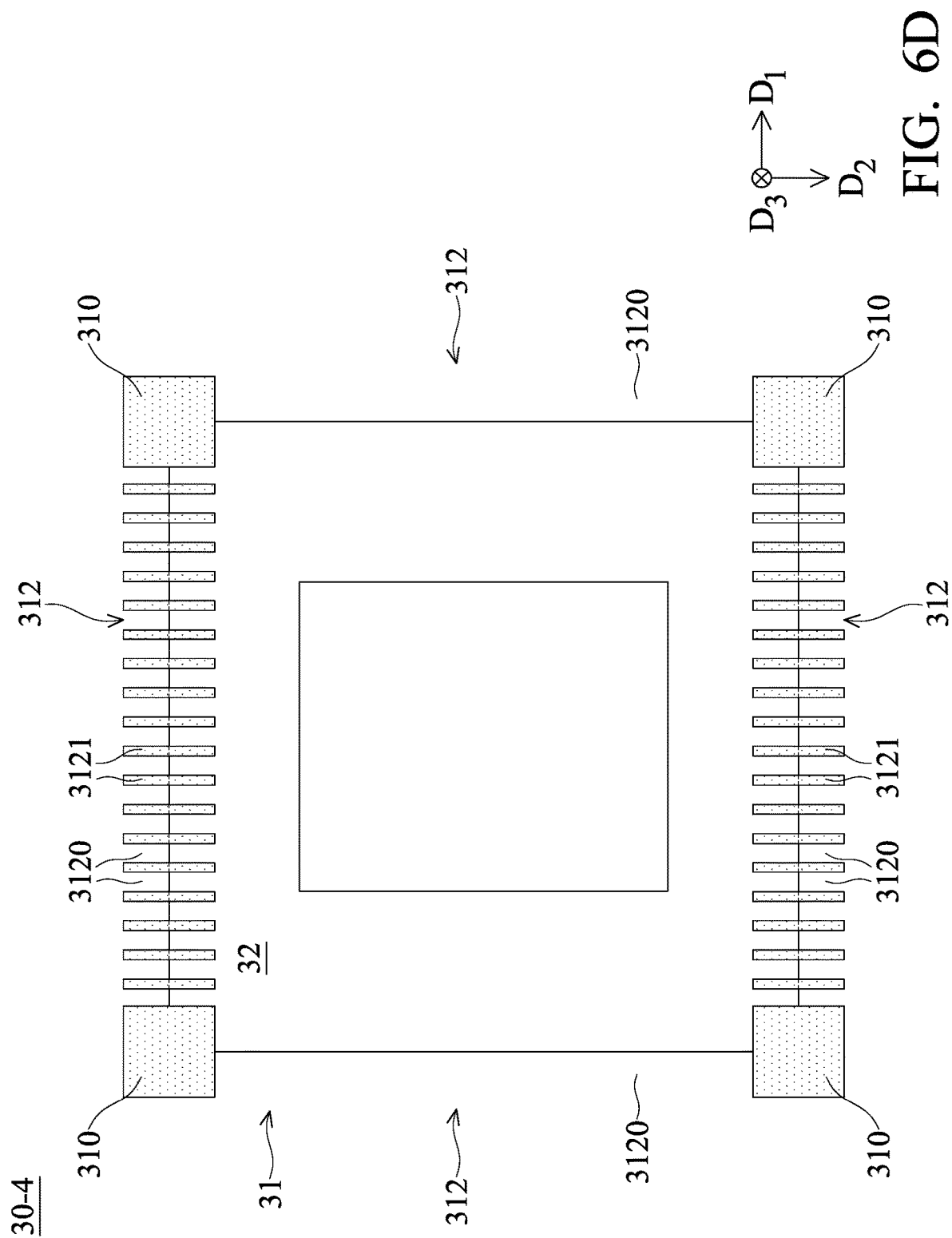
FIG. 6D schematically shows a bottom view of a ring structure with an adhesive layer arranged thereon in accordance with some embodiments.
Figure 7D:
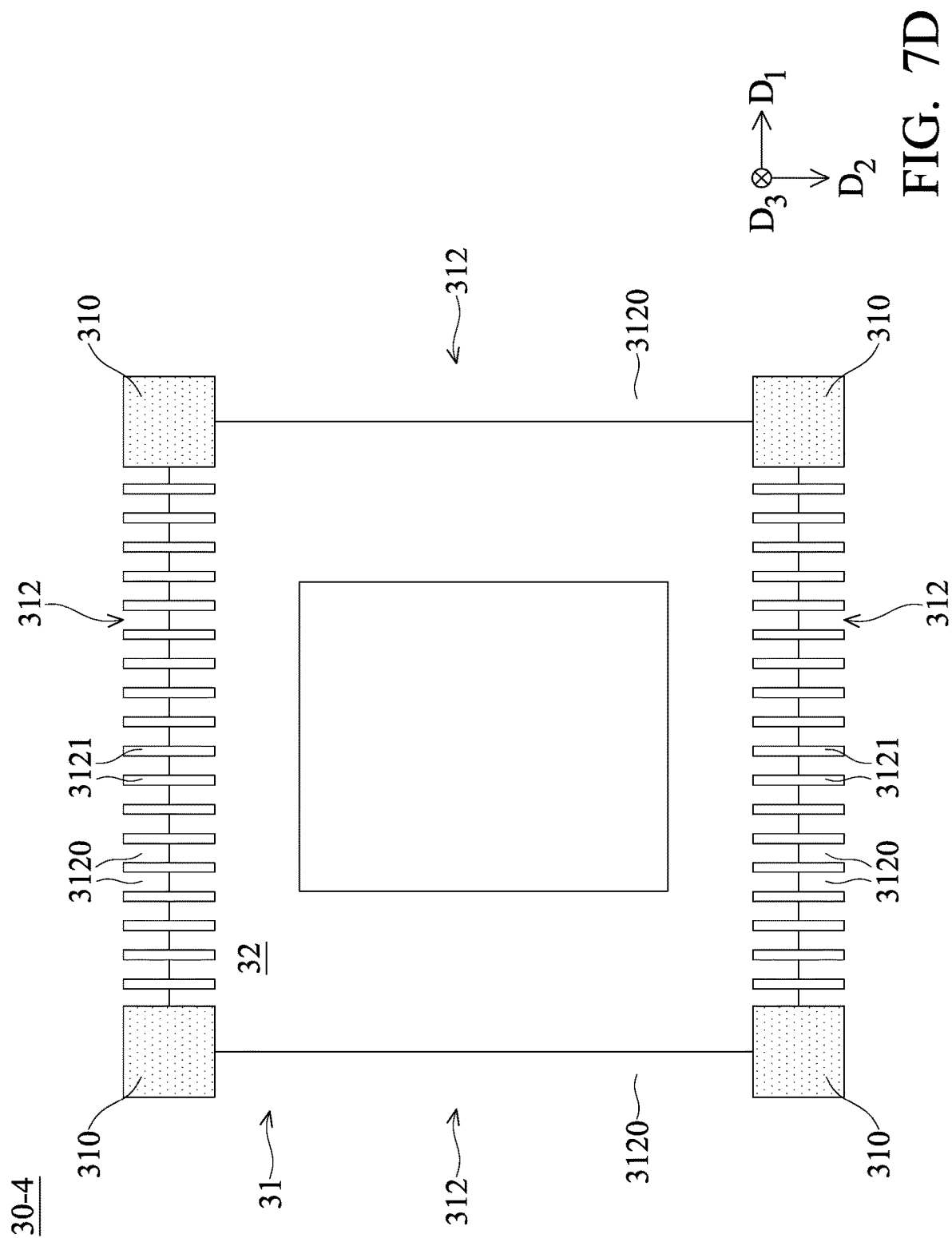
FIG. 7D schematically shows a bottom view of a ring structure with an adhesive layer arranged thereon in accordance with some embodiments.

In FIG. 6D and FIG. 7D, for two opposite sides 312 of the lower ring portion 31, a plurality of notches 3120 are formed in the respective side 312 (such as between some solid columns 3121), and for the other two opposite sides 312 of the lower ring portion 31, only one notch 3120 is formed in the respective side 312 (such as between adjacent corners 310). The adhesive layer 40 may be formed at the four corners 310 and the solid columns 3121 (between the notches 3120) of the lower ring portion 31 (see FIG. 6D), or may be formed only at the four corners 310 of the lower ring portion 31 (see FIG. 7D).

Figure 6E:
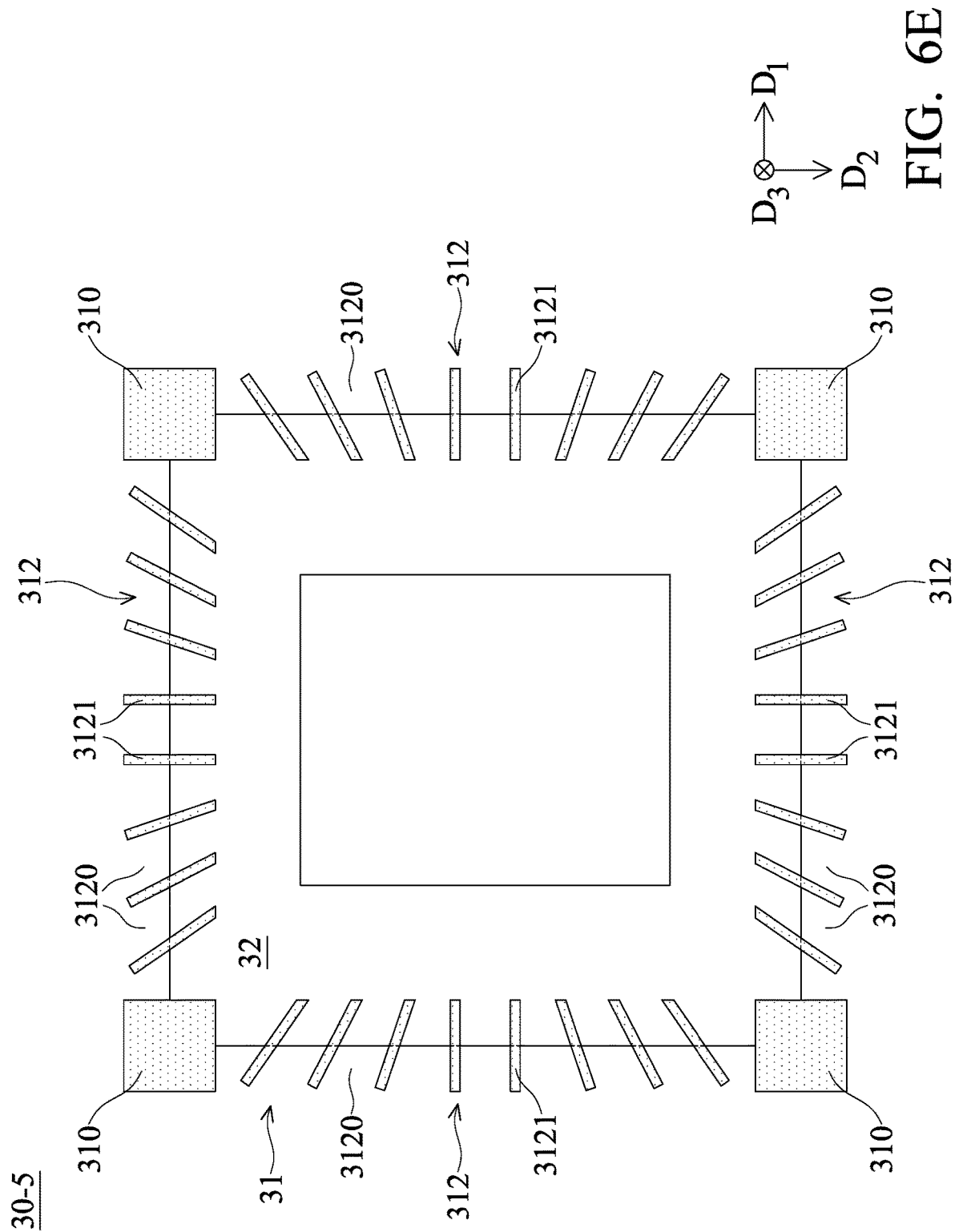
FIG. 6E schematically shows a bottom view of a ring structure with an adhesive layer arranged thereon in accordance with some embodiments.
Figure 7E:
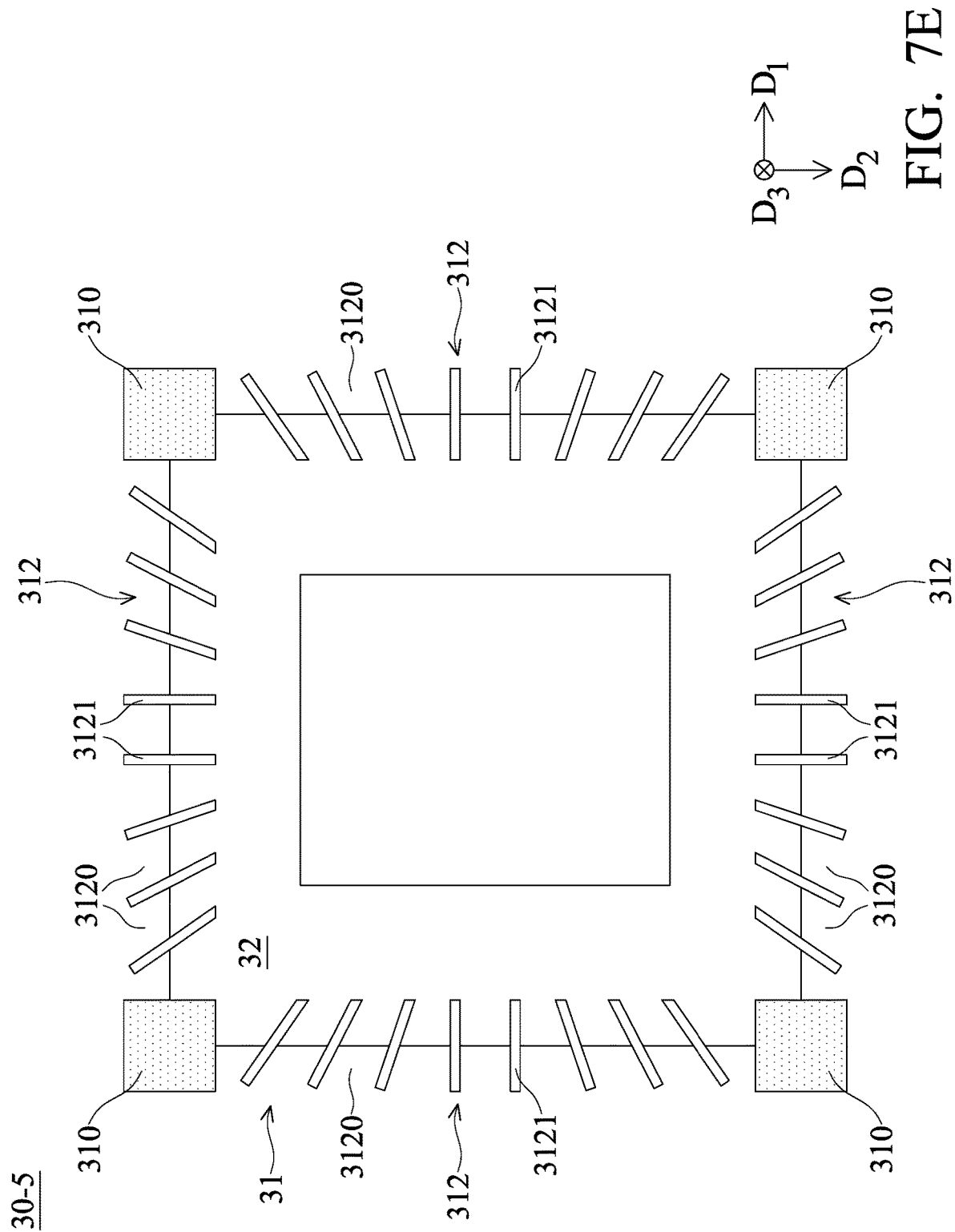
FIG. 7E schematically shows a bottom view of a ring structure with an adhesive layer arranged thereon in accordance with some embodiments.

In FIG. 6E and FIG. 7E, some of the notches 3120 extend in a direction oblique to the extending direction of the respective side 312 of the lower ring portion 31, for example, the notches 3120 arranged near the corners 310 may be inclined to the extending direction of the respective side 312, while the notches 3120 arranged at the center may be perpendicular to the extending direction of the respective side 312. The adhesive layer 40 may be formed at the four corners 310 and the solid columns 3121 (between the notches 3120) of the lower ring portion 31 (see FIG. 6E), or may be formed only at the four corners 310 of the lower ring portion 31 (see FIG. 7E).

Figure 6F:
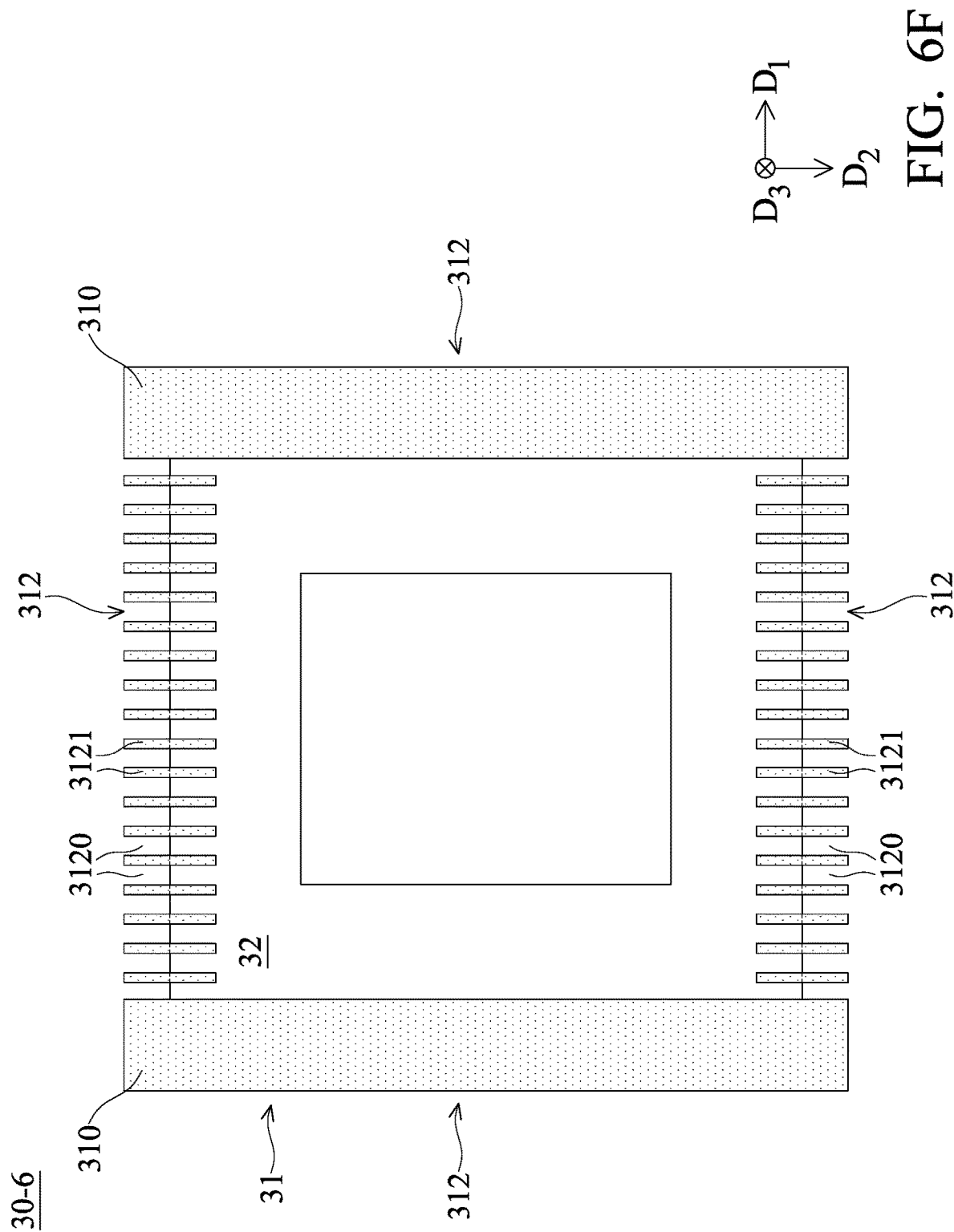
FIG. 6F schematically shows a bottom view of a ring structure with an adhesive layer arranged thereon in accordance with some embodiments.
Figure 7F:
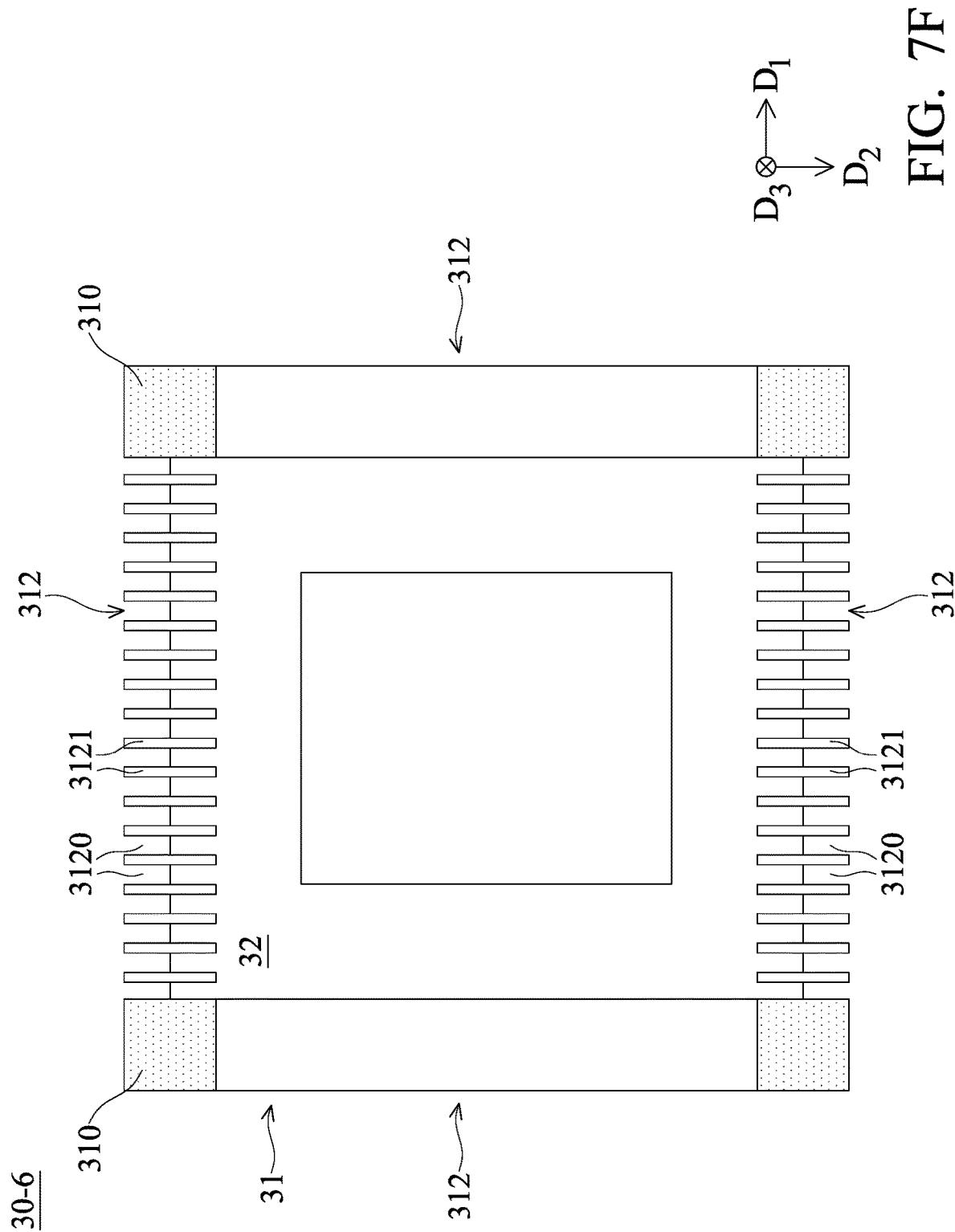
FIG. 7F schematically shows a bottom view of a ring structure with an adhesive layer arranged thereon in accordance with some embodiments.

In FIG. 6F and FIG. 7F, notches 3120 (eliminated parts) are arranged on two opposite sides 312 of the lower ring portion 31, but are not arranged on the other two opposite sides 312 of the lower ring portion 31 (that is, these sides 312 are left). The adhesive layer 40 may be formed at the four corners 310, two left sides 312, and the solid columns 3121 (between the notches 3120) of the lower ring portion 31 (see FIG. 6F), or may be formed only at the four corners 310 of the lower ring portion 31 (see FIG. 7F).

The above ring structures can be selected according to actual needs (for example, various stress concentration locations and/or stress directions in the package). In some embodiments where the die-to-die location and/or die corner location of the package have greater stress, the notches 3120 of the ring structure may be arranged to correspond to those locations, and may also have larger size to relieve the stress, thereby helping avoid damage (for example, cracking or delamination) to the components in those locations.

In addition, the adhesive layer 40 may be formed on a part or all of the (bottom) surface 31A of the lower ring portion 31, in some embodiments (as discussed above), to change the ability of ring structure 30 to control warpage and stress. For example, the adhesive layer 40 may also be formed on only a part of the bottom surface of the solid columns 3121 that extend laterally beyond the upper ring portion 32, as the dashed lines illustrated in FIGS. 6A to 6F. It should be understood that the contact area between the adhesive layer 40 and the surface 31A (or the pattern of adhesive layer 40 over the surface 31A) can affect the coupling effect between the ring structure 30 and the package substrate 10, and even the ability of ring structure 30 to control warpage and stress. Therefore, by changing the configuration of the adhesive layer 40 above the surface 31A, the ring structure 30 can also better control stress and warpage.

It should be understood that the structures described herein are only illustrative, and are not intended to be, and should not be constructed to be, limiting to the present disclosure. Many alternatives and modifications will be apparent to those skilled in the art, once informed by the present disclosure. For example, the shape, arrangement, and/or pattern of the notches 3120 on the lower ring portion 31, and/or the placement of the adhesive layer 40 above the surface 31A may also be changed in different embodiments.

Figure 8:
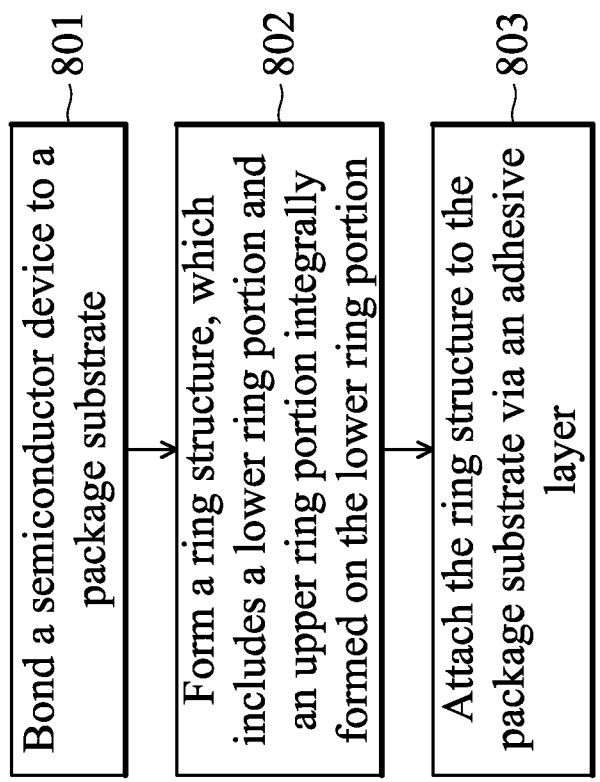
FIG. 8 is a flow chart illustrating a method for forming a semiconductor die package in accordance with some embodiments.

FIG. 8 is a flow chart illustrating a method for forming a semiconductor die package (such as the semiconductor die package 1 or 2 described above) in accordance with some embodiments. In operation 801, a semiconductor device 20 or 20' is placed over the surface 10A of the package substrate 10, as shown in FIG. 2A or FIG. 5. Afterwards, electrical connectors 21 between the semiconductor device 20 or 20' and the package substrate 10 are reflowed to electrically interconnect (i.e., bond) the semiconductor device 20 or 20' with the package substrate 10. In operation 802, a ring structure 30 (or 30') is formed, which includes a lower ring portion 31 with notches 3120 arranged on the side 312 thereof, and an upper ring portion 32 integrally formed on the lower ring portion 31, as previously discussed in FIGS. 3, 4, 6A-6F, and 7A-7F. The one-piece ring structure 30 (or 30') can be formed using, for example, a punching process, another mechanical process, a chemical etching process, a laser ablation process, or another applicable process. In some other embodiments, the lower ring portion 31 and the upper ring portion 32 may be originally separate elements and may be joined together by an adhesive. In operation 803, the ring structure 30 (or 30') is attached to the surface 10A of the package substrate 10 via an adhesive layer 40. The adhesive layer 40 may be applied to the bottom surface 30A of the ring structure 30 (i.e., the bottom surface 31A of the lower ring portion 31) or may be applied over the surface 10A of the package substrate 10, before installing the ring structure 30 (or 30'). In some embodiments, the adhesive layer 40 is formed at a part or all of the surface 31A of the lower ring portion 31, depending on actual needs.

In summary, a semiconductor device package is provided in accordance with some embodiments of the present disclosure. The semiconductor device package includes a novel one-piece ring structure that can relieve or reduce stress generated in the package during thermal cycling without losing its ability to control warpage. Accordingly, the reliability of the entire package structure is improved. Furthermore, in some embodiments, an adhesive layer can be formed at a part of the bottom surface of the ring structure, to allow the ring structure has better ability to control warpage and stress.

In accordance with some embodiments, a semiconductor die package is provided. The semiconductor die package includes a package substrate, a semiconductor device, a ring structure, and an adhesive layer. The semiconductor device is disposed over a first surface of the package substrate. The ring structure is disposed over the first surface of the package substrate and laterally surrounds the semiconductor device. The ring structure includes a lower ring portion arranged around the periphery of the package substrate. Multiple notches are formed along the outer periphery of the lower ring portion. The ring structure also includes an upper ring portion integrally formed on the lower ring portion, wherein the lower ring portion is between the package substrate and the upper ring portion. The upper ring portion laterally extends toward the semiconductor device, so that the inner periphery of the upper ring portion is closer to the semiconductor device than the inner periphery of the lower ring portion. The adhesive layer is interposed between the ring structure and the first surface of the package substrate.

In accordance with some embodiments, a semiconductor die package is provided. The semiconductor die package includes a package substrate, a semiconductor device, a ring structure, and an adhesive layer. The semiconductor device is disposed over a first surface of the package substrate. The ring structure is disposed over the first surface of the package substrate and laterally surrounds the semiconductor device. The ring structure includes a lower ring portion having a rectangular ring shape. Some or all sides of the lower ring portion respectively have one or more notches that penetrate the top surface and the bottom surface of the lower ring portion. The ring structure also includes an upper ring portion, which has a rectangular ring shape, integrally formed on the lower ring portion. The upper ring portion has a part laterally extending toward the semiconductor device and beyond the inner periphery of the lower ring portion. The adhesive layer is interposed between the bottom surface of the lower ring portion and the first surface of the package substrate.

In accordance with some embodiments, a semiconductor die package is provided. The semiconductor die package includes a package substrate, a semiconductor device, a ring structure, and an adhesive layer. The semiconductor device is disposed over a first surface of the package substrate. The ring structure is disposed over the first surface of the package substrate and laterally surrounds the semiconductor device. The ring structure includes a lower ring portion arranged around the periphery of the package substrate. The lower ring portion has multiple notches that penetrate the top surface and the bottom surface of the lower ring portion. The ring structure also includes an upper ring portion concentrically covering the lower ring portion. The inner periphery of the upper ring portion extends beyond the inner periphery of the lower ring portion and laterally surrounds the semiconductor device. The outer periphery of the upper ring portion is spaced apart from the outer periphery of the lower ring portion. The adhesive layer is interposed between the bottom surface of the lower ring portion and the first surface of the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die package, comprising:
a package substrate having a first surface;
a semiconductor device disposed over the first surface of the package substrate;
a ring structure disposed over the first surface of the package substrate and laterally surrounding the semiconductor device, wherein the ring structure comprises:
a lower ring portion arranged around a periphery of the package substrate, wherein a plurality of notches are formed along an outer periphery of the lower ring portion; and
an upper ring portion integrally formed on the lower ring portion, wherein the lower ring portion is between the package substrate and the upper ring portion, and the upper ring portion laterally extends toward the semiconductor device, so that an inner periphery of the upper ring portion is closer to the semiconductor device than an inner periphery of the lower ring portion; and
an adhesive layer interposed between the ring structure and the first surface of the package substrate.

2. The semiconductor die package as claimed in claim 1, wherein an outer periphery of the upper ring portion is spaced apart from the outer periphery of the lower ring portion.

3. The semiconductor die package as claimed in claim 1, wherein there is a gap between a bottom surface of the upper ring portion and the first surface of the package substrate.

4. The semiconductor die package as claimed in claim 1, wherein the adhesive layer is interposed between a bottom surface of the lower ring portion and the first surface of the package substrate.

5. The semiconductor die package as claimed in claim 1, wherein the plurality of notches penetrate a top surface and a bottom surface of the lower ring portion, and extend from the outer periphery of the lower ring portion to the inner periphery of the lower ring portion located below the upper ring portion.

6. The semiconductor die package as claimed in claim 1, wherein the lower ring portion has a rectangular ring shape with four corners and four sides, and the plurality of notches are formed on the four sides.

7. The semiconductor die package as claimed in claim 6, wherein each of the plurality of notches extends in a direction perpendicular to an extending direction of the respective side of the lower ring portion.

8. The semiconductor die package as claimed in claim 1, wherein the plurality of notches have a uniform size.

9. The semiconductor die package as claimed in claim 1, wherein the plurality of notches have two or more different sizes.

10. The semiconductor die package as claimed in claim 1, wherein there is a gap between the inner periphery of the upper ring portion and the semiconductor device, when viewed in a direction perpendicular to the first surface of the package substrate.

11. A semiconductor die package, comprising:
a package substrate having a first surface;
a semiconductor device disposed over the first surface of the package substrate;
a ring structure disposed over the first surface of the package substrate and laterally surrounding the semiconductor device, wherein the ring structure comprises:
a lower ring portion having a rectangular ring shape, wherein all sides of the lower ring portion respectively have a plurality of notches that penetrate a top surface and a bottom surface of the lower ring portion; and
an upper ring portion, which has a rectangular ring shape, integrally formed on the lower ring portion, wherein the upper ring portion has a part laterally extending toward the semiconductor device and beyond an inner periphery of the lower ring portion; and
an adhesive layer interposed between the bottom surface of the lower ring portion and the first surface of the package substrate.

12. The semiconductor die package as claimed in claim 11, wherein a part of the top surface of the lower ring portion is exposed from the upper ring portion.

13. The semiconductor die package as claimed in claim 11, wherein a bottom surface of the part of the upper ring portion is spaced apart from the first surface of the package substrate, and is separated from the adhesive layer.

14. The semiconductor die package as claimed in claim 11, wherein the lower ring portion comprises four corners and four sides, and the all sides of the lower ring portion respectively further have a plurality of solid columns, wherein each of the notches is interposed between adjacent solid columns or between adjacent solid column and corner, and the notches extend from an outer periphery of the lower ring portion toward the inner periphery of the lower ring portion.

15. The semiconductor die package as claimed in claim 14, wherein the adhesive layer is formed at the four corners of the lower ring portion.

16. The semiconductor die package as claimed in claim 14, wherein the adhesive layer is formed at the four corners and the plurality of solid columns of the lower ring portion.

17. The semiconductor die package as claimed in claim 14, wherein each of the notches extends in a direction perpendicular to an extending direction of the respective side of the lower ring portion.

18. The semiconductor die package as claimed in claim 14, wherein some of the notches extend in a direction oblique to an extending direction of the respective side of the lower ring portion.

19. A semiconductor die package, comprising:
a package substrate having a first surface;
a semiconductor device disposed over the first surface of the package substrate;
a ring structure disposed over the first surface of the package substrate and laterally surrounding the semiconductor device, wherein the ring structure comprises:
a lower ring portion arranged around a periphery of the package substrate, wherein the lower ring portion has a plurality of notches that penetrate a top surface and a bottom surface of the lower ring portion; and
an upper ring portion concentrically covering the lower ring portion, wherein an inner periphery of the upper ring portion extends beyond an inner periphery of the lower ring portion and laterally surrounds the semiconductor device, and an outer periphery of the upper ring portion is spaced apart from an outer periphery of the lower ring portion; and
an adhesive layer interposed between the bottom surface of the lower ring portion and the first surface of the package substrate.

20. The semiconductor die package as claimed in claim 19, wherein the lower ring portion comprises four corners and four sides, and all of the four sides respectively have a plurality of solid columns, wherein each of the plurality of notches is formed between adjacent solid columns, between adjacent corners, or between adjacent solid column and corner, wherein the adhesive layer is formed at the four corners and the plurality of solid columns.

* * * * *